(12) United States Patent
Makala et al.

(10) Patent No.: US 9,484,357 B2
(45) Date of Patent: Nov. 1, 2016

(54) SELECTIVE BLOCKING DIELECTRIC FORMATION IN A THREE-DIMENSIONAL MEMORY STRUCTURE

(71) Applicant: SanDisk Technologies, Inc., Plano, TX (US)

(72) Inventors: Raghuveer S. Makala, Campbell, CA (US); Rahul Sharangpani, Fremont, CA (US); Senaka Krishna Kanakamedala, Milpitas, CA (US); Xiaofeng Liang, Palo Alto, CA (US); George Matamis, Danville, CA (US); Sateesh Koka, Milpitas, CA (US); Johann Alsmeier, San Jose, CA (US)

(73) Assignee: SANDISK TECHNOLOGIES LLC, Milpitas, CA (US)

( * ) Notice: Subject to any disclaimer, the term of this patent is extended or adjusted under 35 U.S.C. 154(b) by 0 days.

(21) Appl. No.: 14/571,824

(22) Filed: Dec. 16, 2014

(65) Prior Publication Data

US 2016/0172370 A1 Jun. 16, 2016

(51) Int. Cl.
*H01L 23/12* (2006.01)
*H01L 23/053* (2006.01)
(Continued)

(52) U.S. Cl.
CPC ..... *H01L 27/11582* (2013.01); *G11C 16/0483* (2013.01); *G11C 16/06* (2013.01);
(Continued)

(58) Field of Classification Search
CPC ............. H01L 21/311; H01L 21/0228; H01L 21/3141; H01L 21/762; H01L 21/3015; H01L 21/048; H01L 21/8229; H01L 21/02241; H01L 27/115; H01L 27/1157; H01L 27/11575; H01L 29/76; H01L 29/7869; H01L 29/66833; H01L 29/66825
USPC ....... 257/200, 201, 324, 387, 393, 410, 411, 257/622, 701, 780, E21.006, E21.027, 257/E21.045, E21.126, E21.127, E21.267, 257/E21.17, E21.304, E21.645
See application file for complete search history.

(56) References Cited

U.S. PATENT DOCUMENTS 5,915,167 A 6/1999 Leedy
8,987,087 B2 * 3/2015 Chien ............... H01L 29/66825
257/E29.309
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — David Nhu
(74) *Attorney, Agent, or Firm* — The Marbury Law Group PLLC

(57) ABSTRACT

A plurality of blocking dielectric portions can be formed between a memory stack structure and an alternating stack of first material layers and second material layers by selective deposition of a dielectric material layer. The plurality of blocking dielectric portions can be formed after removal of the second material layers selective to the first material layers by depositing a dielectric material on surfaces of the memory stack structure while avoiding deposition on surfaces of the first material layers. A deposition inhibitor material layer or a deposition promoter material layer can be optionally employed. Alternatively, the plurality of blocking dielectric portions can be formed on surfaces of the second material layers while avoiding deposition on surfaces of the first material layers after formation of the memory opening and prior to formation of the memory stack structure. The plurality of blocking dielectric portions are vertically spaced annular structures.

24 Claims, 29 Drawing Sheets

(51) Int. Cl.
| | |
|---|---|
| H01L 27/115 | (2006.01) |
| G11C 16/04 | (2006.01) |
| G11C 16/06 | (2006.01) |
| H01L 29/788 | (2006.01) |
| H01L 29/51 | (2006.01) |
| H01L 29/423 | (2006.01) |
| H01L 21/28 | (2006.01) |

(52) U.S. Cl.
CPC ... *H01L21/28273* (2013.01); *H01L 21/28282* (2013.01); *H01L 27/1157* (2013.01); *H01L 27/11524* (2013.01); *H01L 27/11556* (2013.01); *H01L 29/4234* (2013.01); *H01L 29/42324* (2013.01); *H01L 29/42364* (2013.01); *H01L 29/513* (2013.01); *H01L 29/517* (2013.01); *H01L 29/518* (2013.01); *H01L 29/7883* (2013.01)

(56) References Cited

U.S. PATENT DOCUMENTS

| | | | | |
|---|---|---|---|---|
| 8,987,089 | B1 * | 3/2015 | Pachamuthu | H01L 27/11551 438/268 |
| 9,136,130 | B1 * | 9/2015 | Wada | H01L 27/11556 |
| 9,230,974 | B1 * | 1/2016 | Pachamuthu | H01L 27/11556 |
| 9,230,979 | B1 * | 1/2016 | Pachamuthu | H01L 27/11575 |
| 9,230,980 | B2 * | 1/2016 | Rabkin | H01L 27/11578 |
| 9,230,983 | B1 * | 1/2016 | Sharangpani | H01L 27/11582 |
| 9,230,984 | B1 * | 1/2016 | Takeguchi | H01L 27/11582 |
| 9,236,392 | B1 * | 1/2016 | Izumi | H01L 27/11524 |
| 2012/0001252 | A1 | 1/2012 | Alsmeier et al. | |
| 2014/0054676 | A1 | 2/2014 | Nam et al. | |

OTHER PUBLICATIONS

Chen, R. et al., "Chemistry for Positive Pattern Transfer Using Area-Selective Atomic Layer Deposition," Advanced Materials, vol. 18, pp. 1086-1090, (2006).

Moshe, H. et al., "Atomic Layer Deposition on Self-Assembled Monolayers," Materials Science—Advanced Topics, Chapter 3, pp. 63-84, (2013).

Spencer, D. F., NNUN Workshop on Electron Beam Lithography for Nanostructure Fabrication, Presentation Titles, "Resist & Resist Processing," Cornell Nanofabrication Facility, Cornell University, Ithaca, NY, 15 pages, (Jan. 14-15, 2002).

Dumas, P. et al., "Electron-Energy-Loss Characterization of the H-Terminated Si(111) and Si(100) Surfaces Obtained by Etching in $NH_4F$," Chemical Physics Letters, vol. 181, No. 6, pp. 537-543, (1991).

Kobayashi, N. P. et al., "Two-Stage Atomic Layer Deposition of Smooth Aluminum Oxide on Hydrophobic Self-Assembled Monolayers," Engineering Letters, vol. 16, No. 2, 6 pages, (2008).

Wang, M. et al., "Self-Assembled Silane Monolayers: Fabrication with Nanoscale Uniformity," Langmuir, vol. 21, pp. 1848-4857, (2005).

Dong, W. et al., "Application of Three-Dimensionally Area-Selective Atomic Layer Deposition for Selective Coating the Vertical Surfaces of Standing Nanopillars," Scientific Reports, vol. 4, pp. 1-4, (2014).

Sung, M. M. et al., "Formation of Alkylsiloxane Self-Assembled Monolayers on $Si_3N_4$," J. Vac. Sci. Technol. A, vol. 17, No. 2, pp. 540-544, (1999).

Knez, M. et al., "Synthesis and Surface Engineering of Complex Nanostructures by Atomic Layer Deposition," Adv. Mater., vol. 19, pp. 3425-3438, (2007).

Li, M., "Modification of Silicon by Self-Assembled Monolayers for Application in Nano-Electronics and Biology," Dissertation Submitted to the Graduate School-New Brunswick, Rutgers, The State University of New Jersey for Degree of Doctor of Philosophy, 195 pages, (2007).

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/319,283, filed Jun. 30, 2014, SanDisk Technologies Inc.

U.S. Appl. No. 14/183,152, filed Feb. 18, 2014, SanDisk Technologies Inc.

Invitation to Pay Additional Fees and Communication Relating to the Results of the Partial International Search for PCT/US2015/053841, 9 pages, dated Dec. 21, 2015.

International Search Report and Written Opinion of International Searching Authority for PCT/US2015/053841, 19 pages, dated Feb. 24, 2016.

* cited by examiner

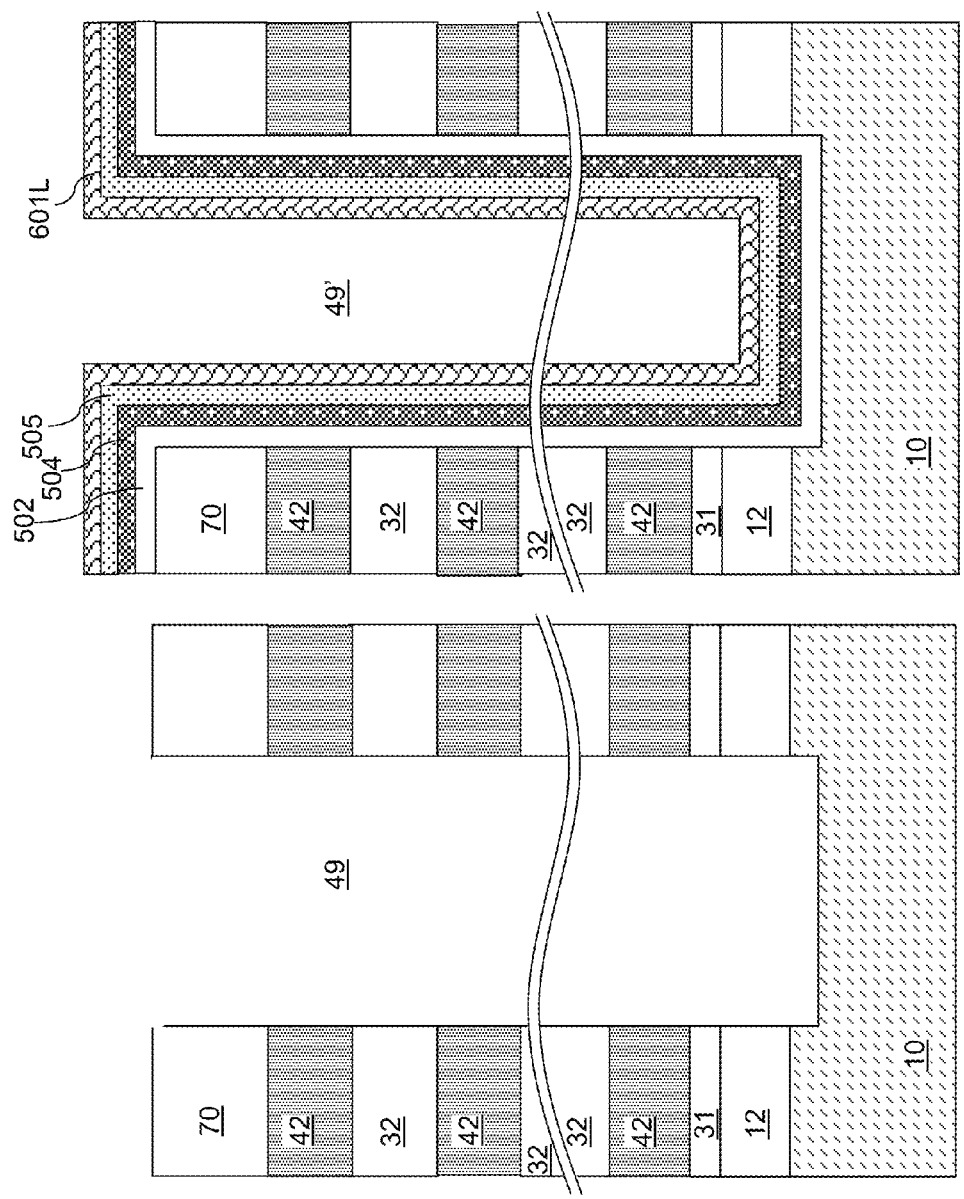

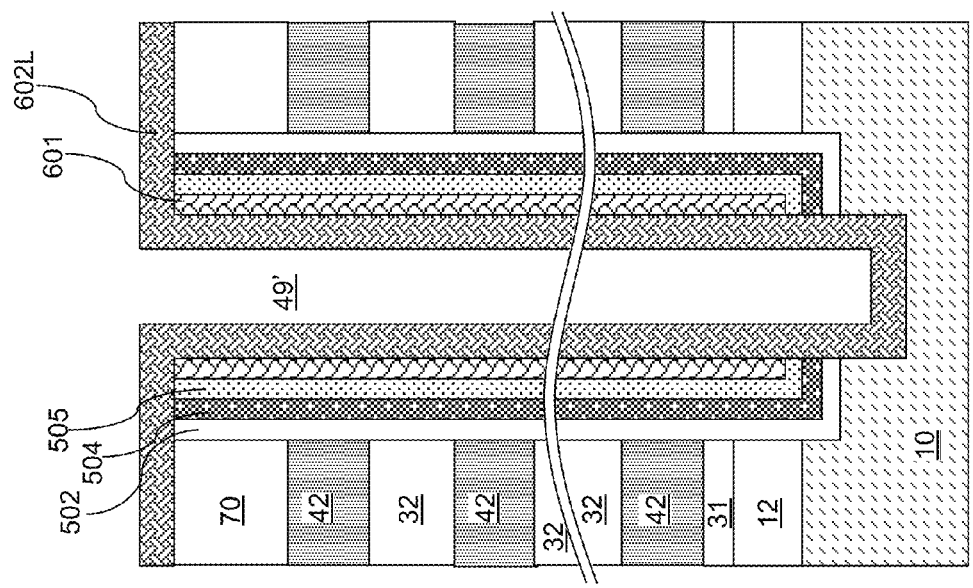
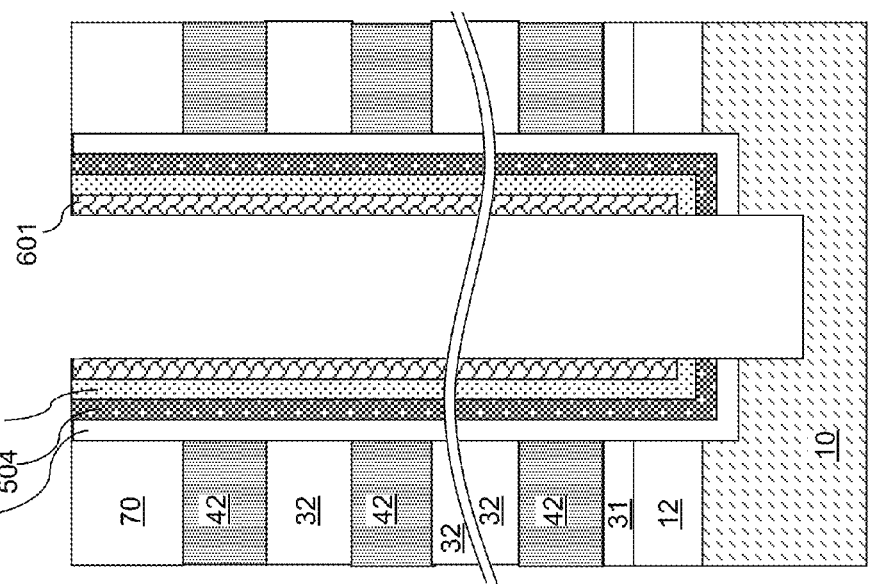
FIG. 2D
FIG. 2C

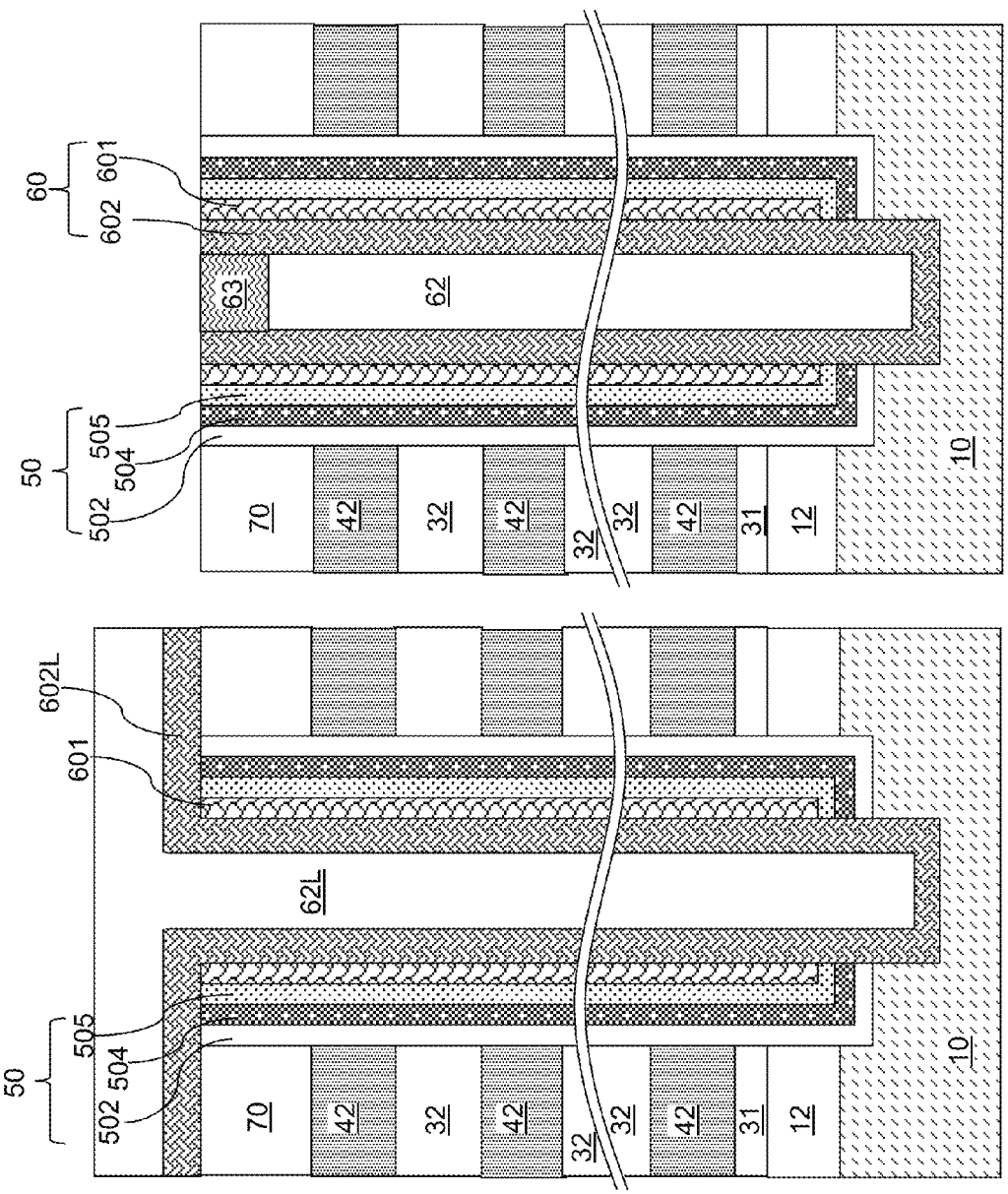

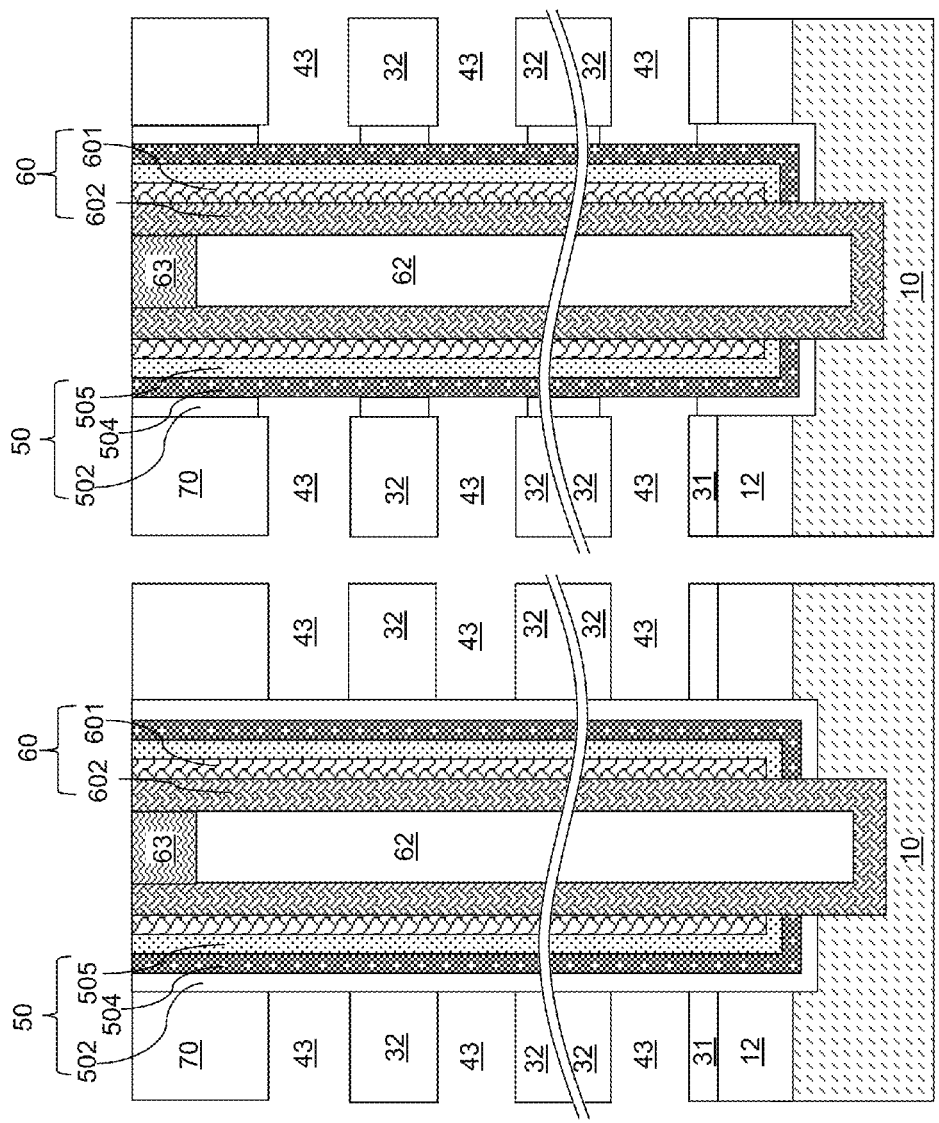

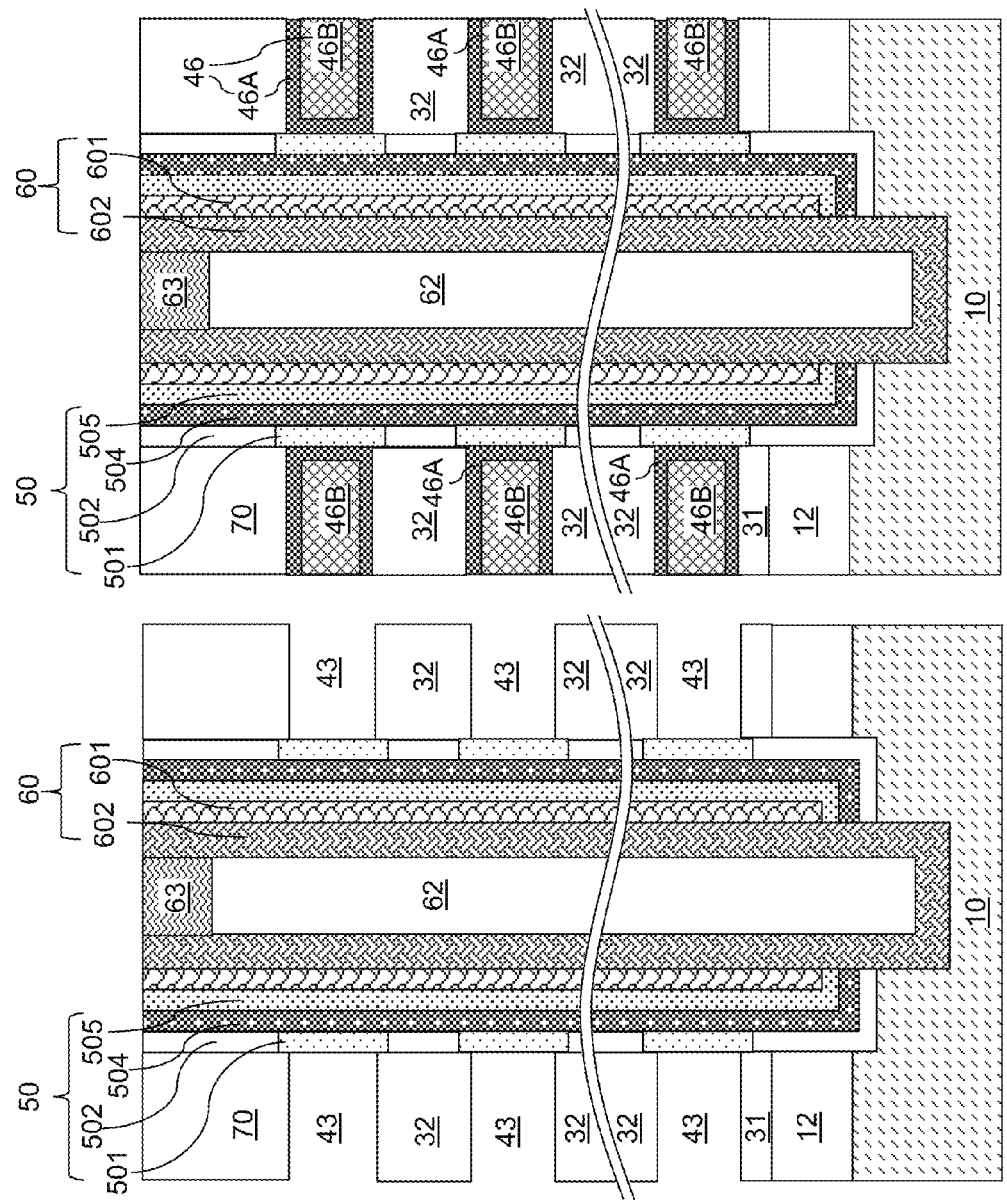

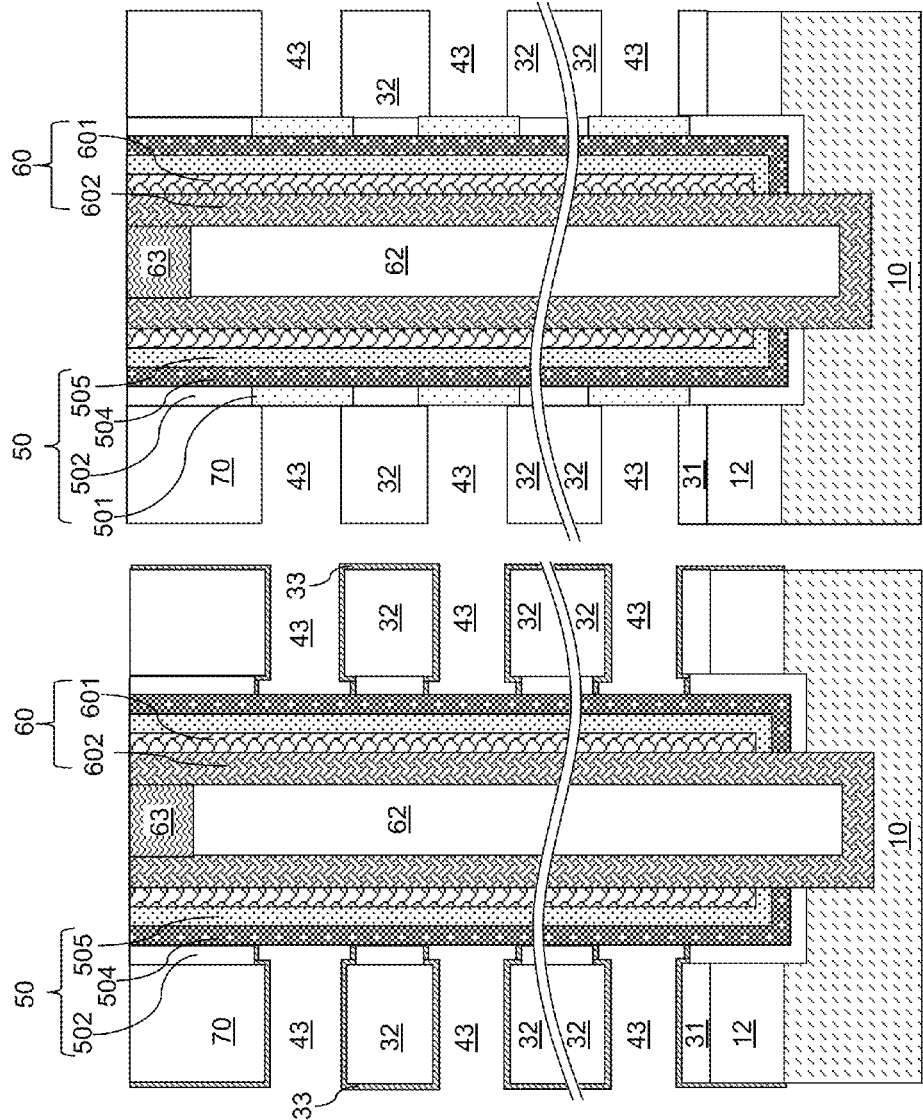

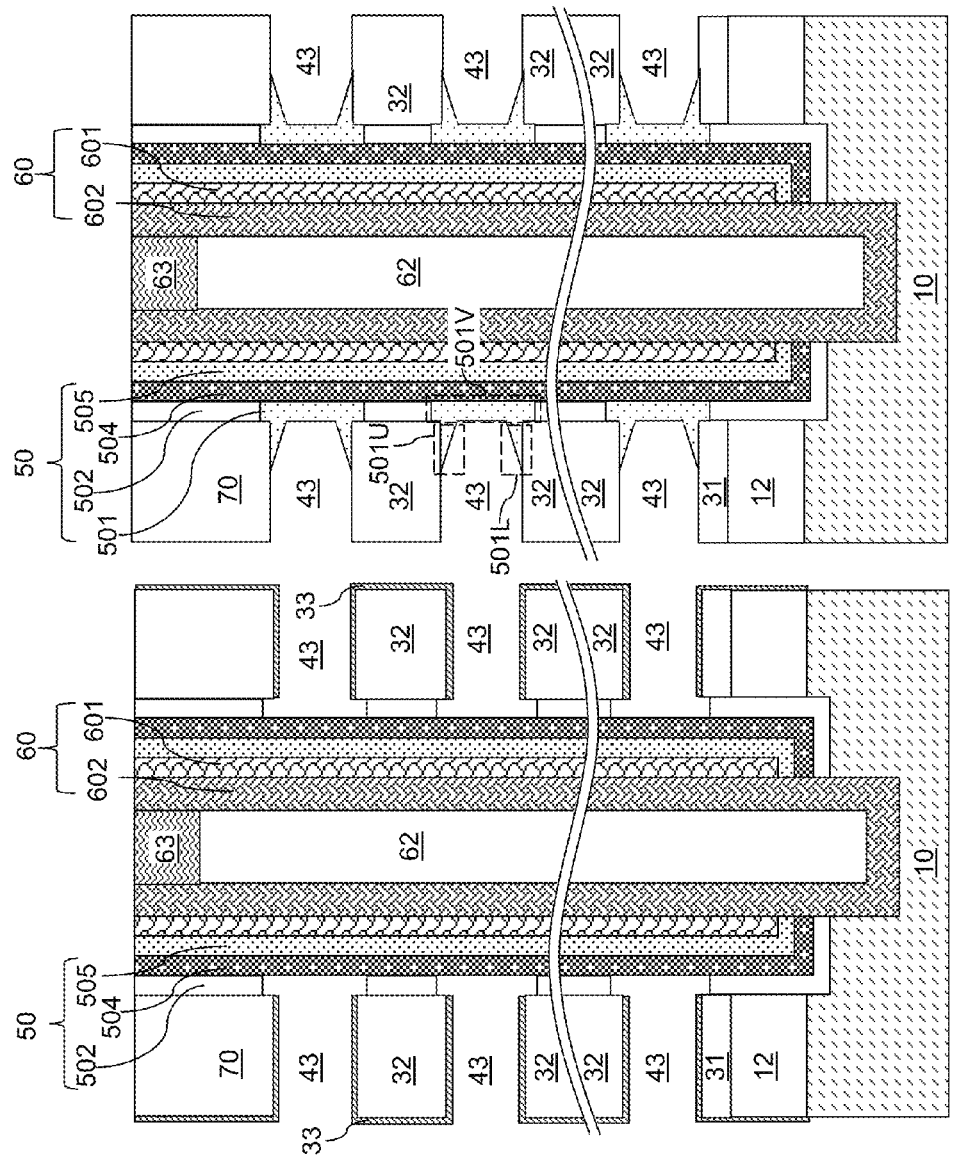

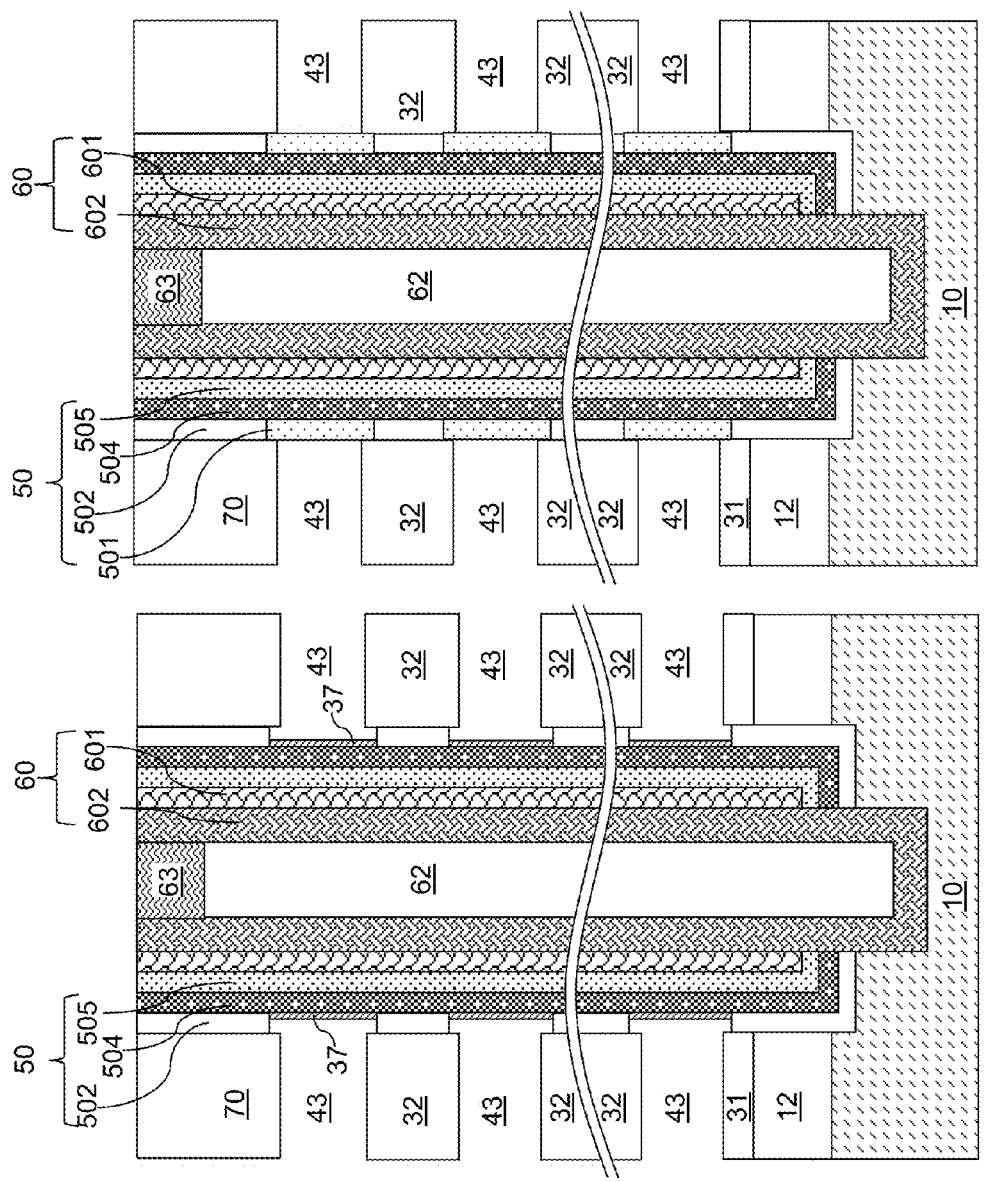

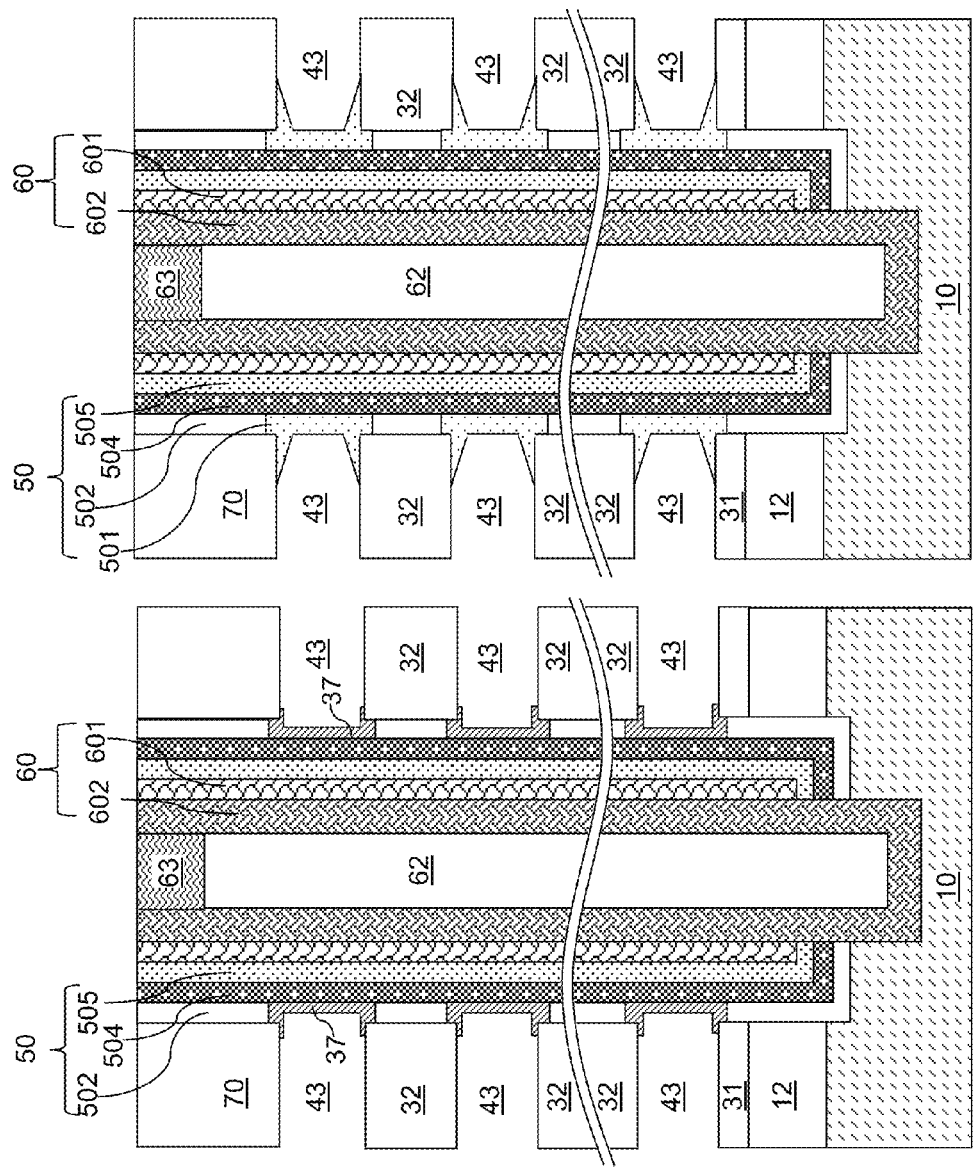

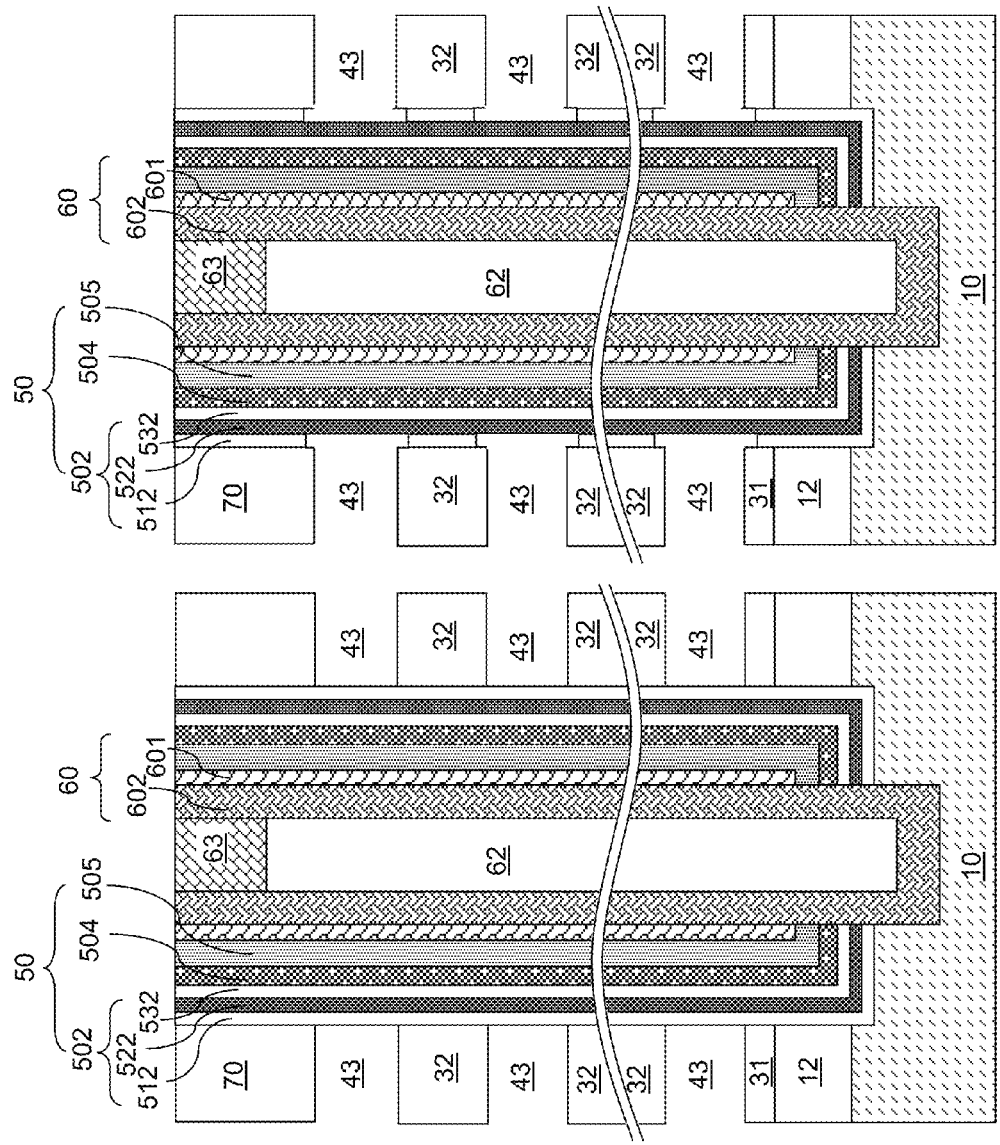

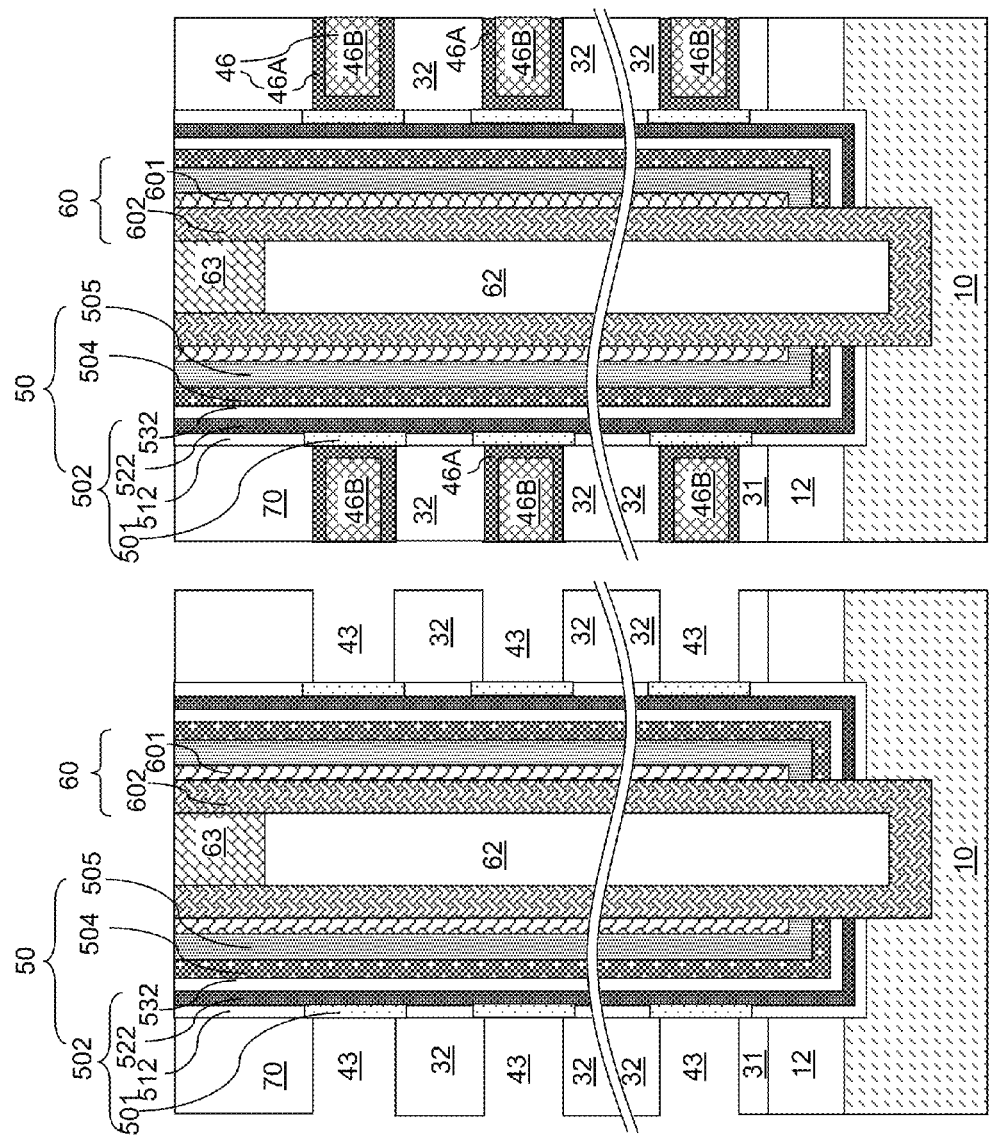

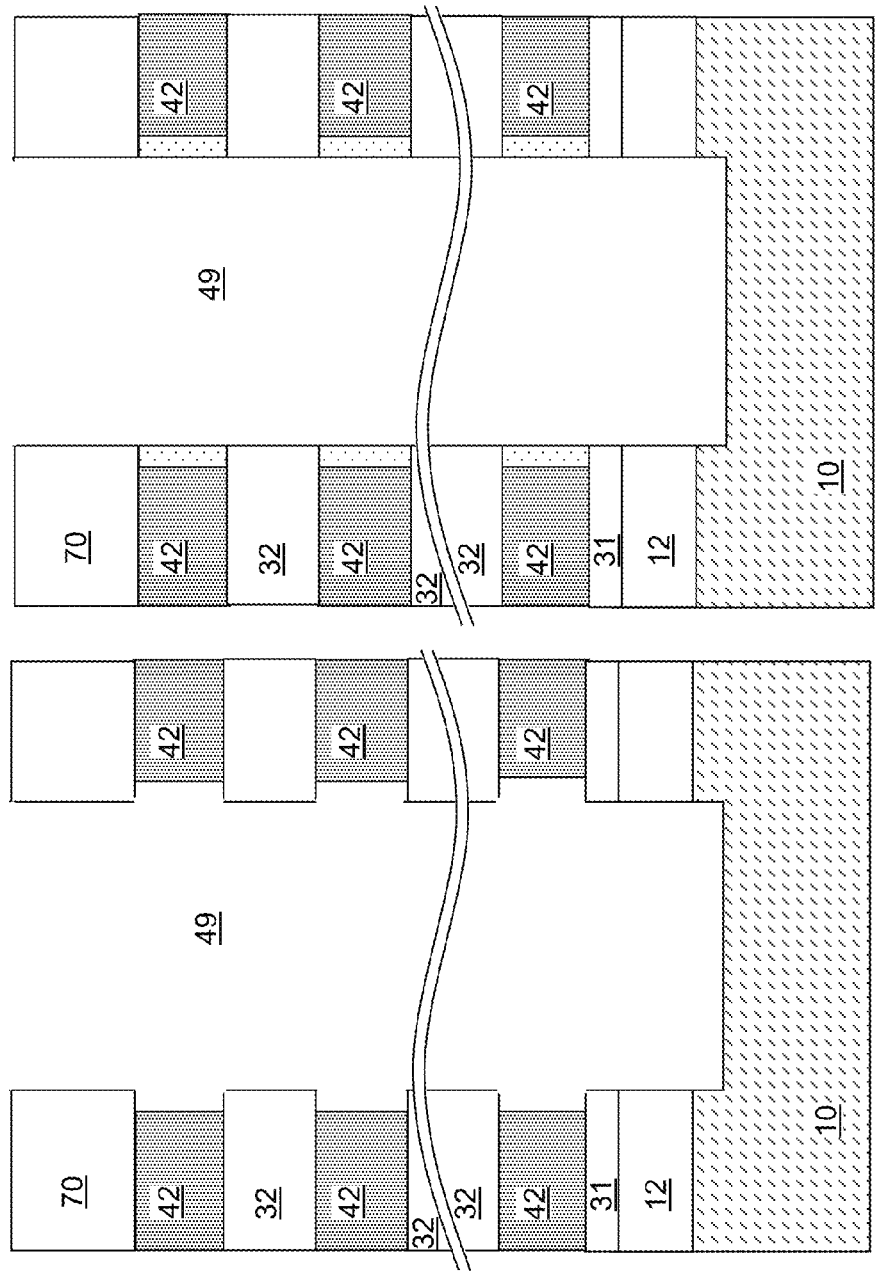

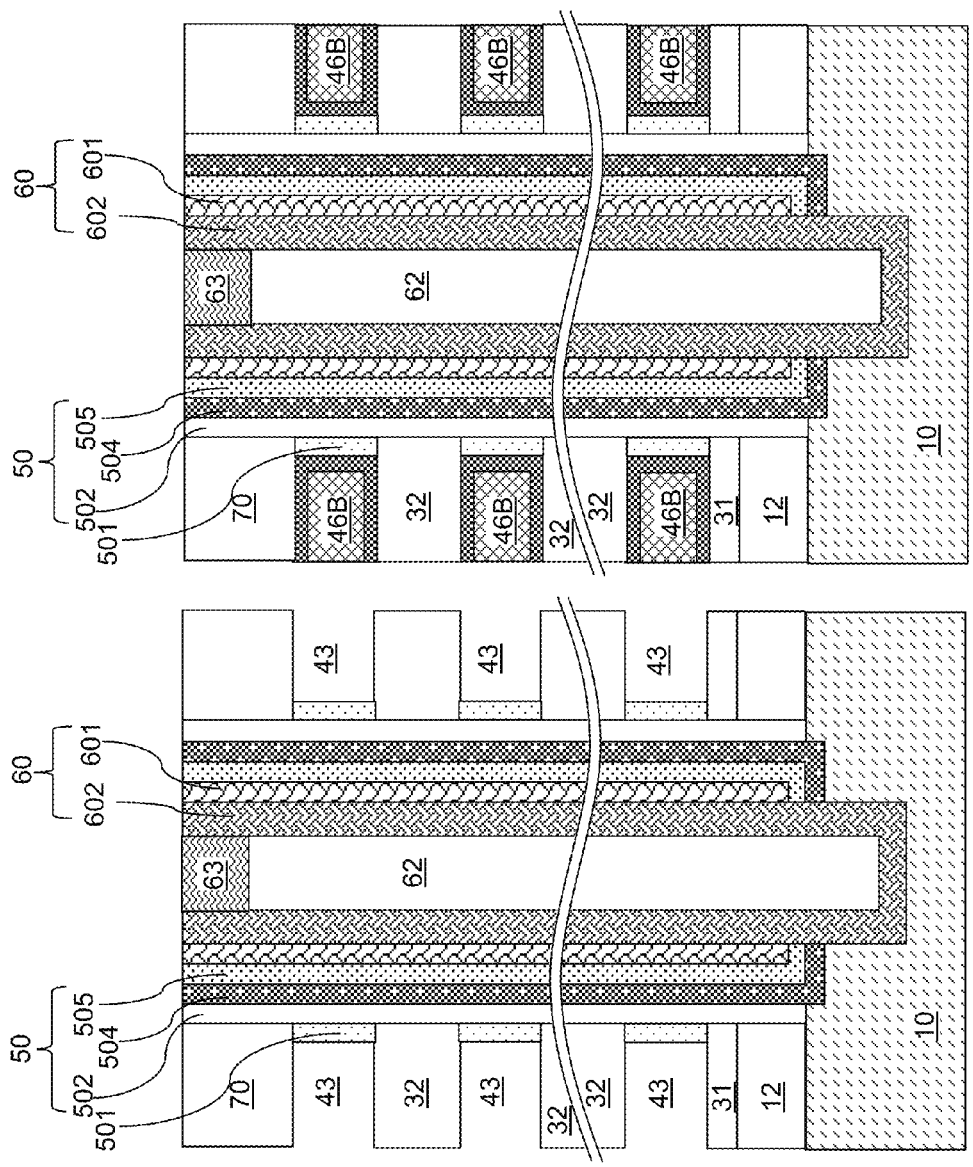

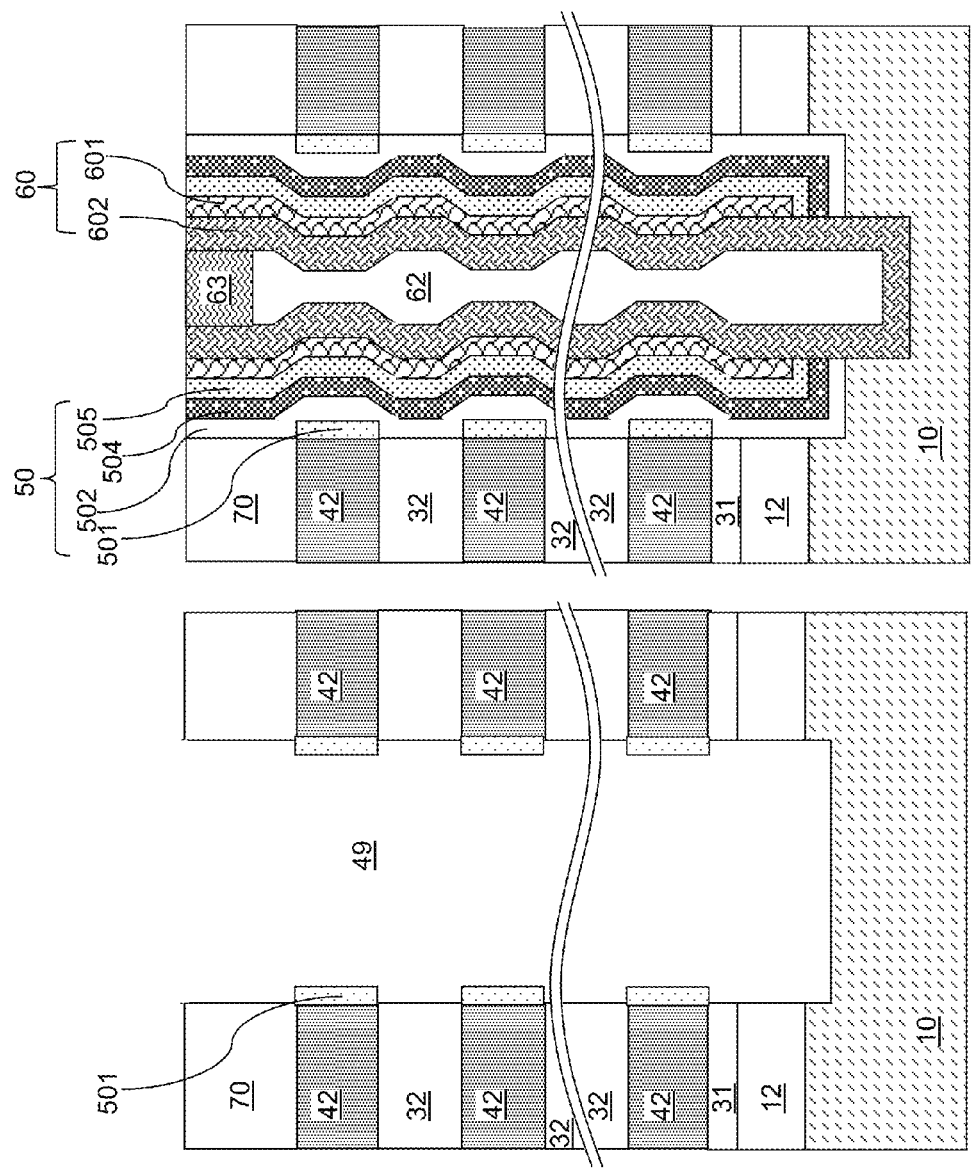

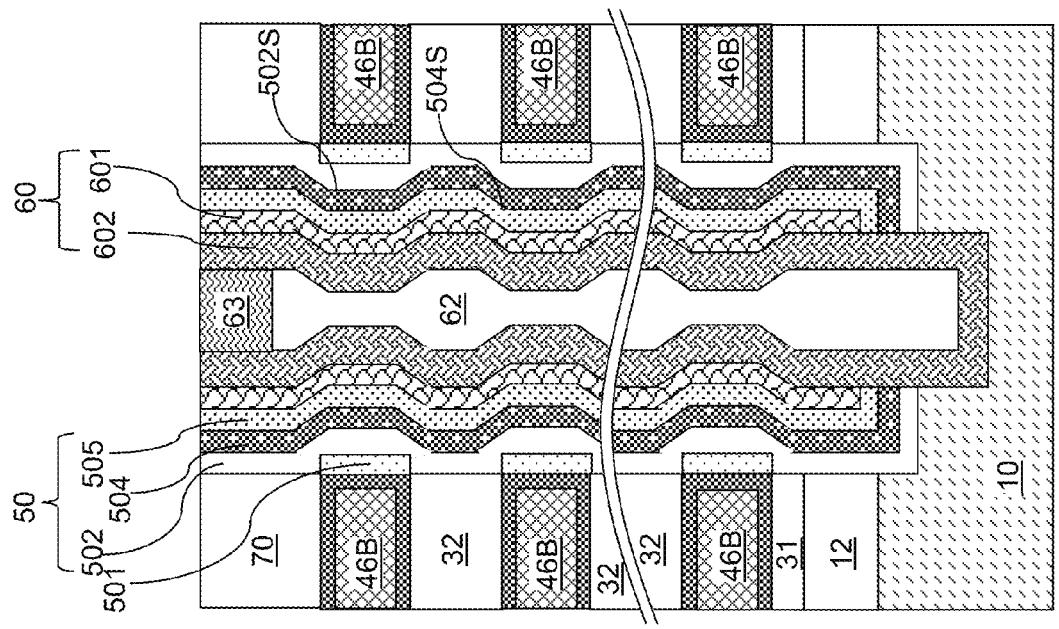
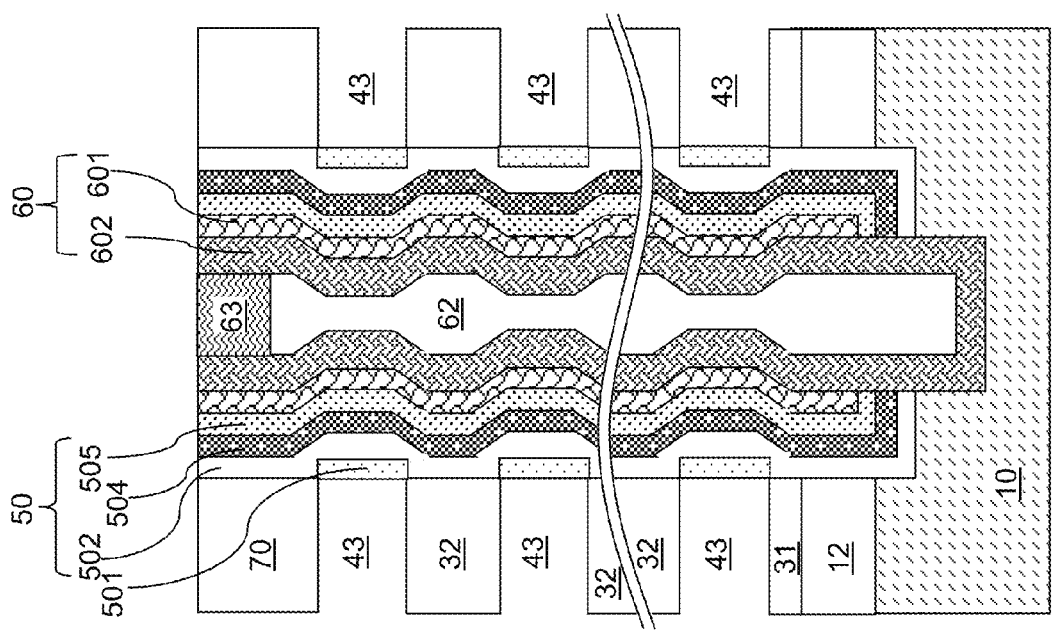
FIG. 19A
FIG. 19B

SELECTIVE BLOCKING DIELECTRIC FORMATION IN A THREE-DIMENSIONAL MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional NAND memory device is provided, which comprises a stack of alternating layers comprising insulator layers and electrically conductive layers and located over a substrate, a memory opening extending through the stack, a lateral stack located within the memory opening and comprising, from outside to inside, a memory film and a semiconductor channel, and a plurality of blocking dielectric portions. The plurality of blocking dielectric portions are vertically spaced from each other, comprise a dielectric metal oxide having a dielectric constant greater than 7.9, and contact a respective portion of an outer sidewall of the memory film and a sidewall of a respective electrically conductive layer.

According to another aspect of the present disclosure, a method of manufacturing a three-dimensional memory structure is provided. A stack of alternating layers comprising first material layers and second material layers is formed over a substrate. A memory opening is formed through the stack to a top surface of the substrate. A memory film and a semiconductor channel material are formed in the memory opening. Backside recesses are formed by removing the second material layers selective to the first material layers and the memory film. Electrically conductive layers are formed within the backside recesses. A plurality of blocking dielectric portions comprising a dielectric metal oxide is formed between the memory film and the respective material layers by a selective deposition process.

BRIEF DESCRIPTION OF THE DRAWINGS

FIGS. 2A-2F are sequential vertical cross-sectional views of a memory opening within the exemplary structure during various processing steps employed to form a first exemplary memory stack structure according to an embodiment of the present disclosure.

FIGS. 6A-6D are a sequence of vertical cross-sectional views of a first exemplary memory stack structure during formation of electrically conductive lines according to an embodiment of the present disclosure.

FIGS. 7A and 7B are a sequence of vertical cross-sectional views of a second exemplary memory stack structure during formation of electrically conductive lines according to an embodiment of the present disclosure.

FIGS. 8A-8C are a sequence of vertical cross-sectional views of a third exemplary memory stack structure during formation of electrically conductive lines according to an embodiment of the present disclosure.

FIGS. 9A and 9B are a sequence of vertical cross-sectional views of a fourth exemplary memory stack structure during formation of electrically conductive lines according to an embodiment of the present disclosure.

FIGS. 10A-10C are a sequence of vertical cross-sectional views of a fifth exemplary memory stack structure during formation of electrically conductive lines according to an embodiment of the present disclosure.

FIGS. 15A-15D are a sequence of vertical cross-sectional views of the sixth exemplary memory stack structure during formation of electrically conductive lines according to an embodiment of the present disclosure.

FIGS. 16A-16C are sequential vertical cross-sectional views of a memory opening within the exemplary structure during various processing steps employed to form a seventh exemplary memory stack structure according to an embodiment of the present disclosure.

FIGS. 17A and 17B are a sequence of vertical cross-sectional views of the seventh exemplary memory stack structure during formation of electrically conductive lines according to an embodiment of the present disclosure.

FIGS. 18A and 18B are sequential vertical cross-sectional views of a memory opening within the exemplary structure during various processing steps employed to form an eighth exemplary memory stack structure according to an embodiment of the present disclosure.

FIGS. 19A and 19B are a sequence of vertical cross-sectional views of the eighth exemplary memory stack structure during formation of electrically conductive lines according to an embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
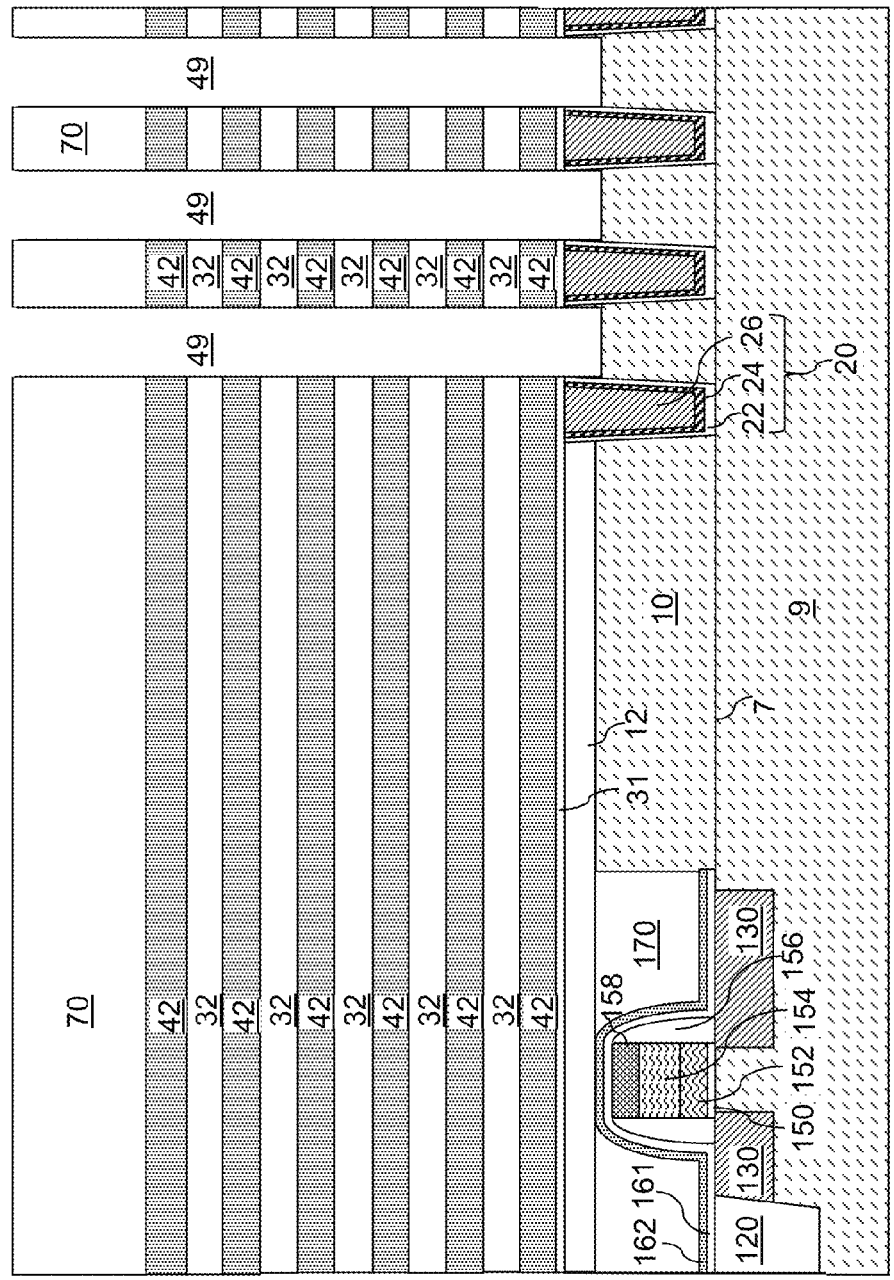
FIG. 1 is a vertical cross-sectional view of an exemplary structure after formation of a stack including an alternating plurality of material layers and memory openings extending through the stack according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, over the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulator layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the unrecessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, a series of layers including at least one blocking dielectric layer 502, a memory material layer 504, a tunneling dielectric layer 505, and an optional first semiconductor channel layer 601L can be sequentially deposited in the memory openings 49. The at least one blocking dielectric layer 502 can include a single blocking dielectric layer or a layered stack of a plurality of blocking dielectric layers.

The at least one blocking dielectric layer 502 can be deposited on the sidewalls of each memory opening 49 by a conformal deposition method. The at least one blocking dielectric layer 502 includes a dielectric material, which can be silicon oxide and/or a dielectric metal oxide. In one embodiment, the at least one blocking dielectric layer 502 can be a silicon oxide layer. The thickness of the at least one blocking dielectric layer 502 can be in a range from 3 nm to 12 nm, although lesser and greater thicknesses can also be employed.

Subsequently, the memory material layer 504, the tunneling dielectric layer 505, and the optional first semiconductor channel layer 601L can be sequentially formed. In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

The tunneling dielectric layer 505 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505 can include a stack of a first silicon oxide layer, a silicon oxynitride layer, and a second silicon oxide layer, which is commonly known as an ONO stack. In one embodiment, the tunneling dielectric layer 505 can include a silicon oxide layer that is substantially free of carbon or a silicon oxynitride layer that is substantially free of carbon. The thickness of the tunneling dielectric layer 505 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (502, 504, 505, 601L).

Referring to FIG. 2C, the optional first semiconductor channel layer 601L, the tunneling dielectric layer 505, the memory material layer 504, the at least one blocking dielectric layer 502 are sequentially anisotropically etched employing at least one anisotropic etch process. The portions of the first semiconductor channel layer 601L, the tunneling dielectric layer 505, the memory material layer 504, and the at least one blocking dielectric layer 502 located above the top surface of the insulating cap layer 70 can be removed by the at least one anisotropic etch process. Further, the horizontal portions of the first semiconductor channel layer 601L, the tunneling dielectric layer 505, the memory material layer 504, and the at least one blocking dielectric layer 502 at a bottom of each cavity 49' can be removed to form openings in remaining portions thereof. Each of the first semiconductor channel layer 601L, the tunneling dielectric layer 505, the memory material layer 504, and the at least one blocking dielectric layer 502 can be etched by anisotropic etch process.

Each remaining portion of the first semiconductor channel layer 601L constitutes a first semiconductor channel portion 601. Each remaining portion of the memory material layer 504 includes at least one charge storage element, and can include a plurality of charge storage elements. In one embodiment, the number of the charge storage elements in a memory material layer 504 can be at least the total number of control gate electrodes to be formed around the memory material layer 504. In one embodiment, the memory material layer 504 can be a contiguous layer, i.e., can be a charge storage layer. A surface of the semiconductor material layer 10 (or the substrate semiconductor layer 9 if the semiconductor material layer 10 is not present) can be physically exposed underneath the opening through the first semiconductor channel portion 601, the tunneling dielectric layer 505, the memory material layer 504, and the at least one blocking dielectric layer 502. Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance, rd. A tunneling dielectric layer 505 is embedded within a memory material layer 504. The memory material layer 504 can comprise a charge trapping material or a floating gate material.

In one embodiment, the first semiconductor channel portion 601, the tunneling dielectric layer 505, the memory material layer 504, and the at least one blocking dielectric layer 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2D, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2E, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2F, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric layer 505 is embedded within a memory material layer 504, and laterally surrounds a portion of the semiconductor channel 60. Each adjoining set of at least one blocking dielectric layer 502, a memory material layer 504, and a tunneling dielectric layer 505 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. Within each memory opening, a lateral stack is formed, which includes, from outside to inside, a memory film 50 and a semiconductor channel 60.

Figure 3:
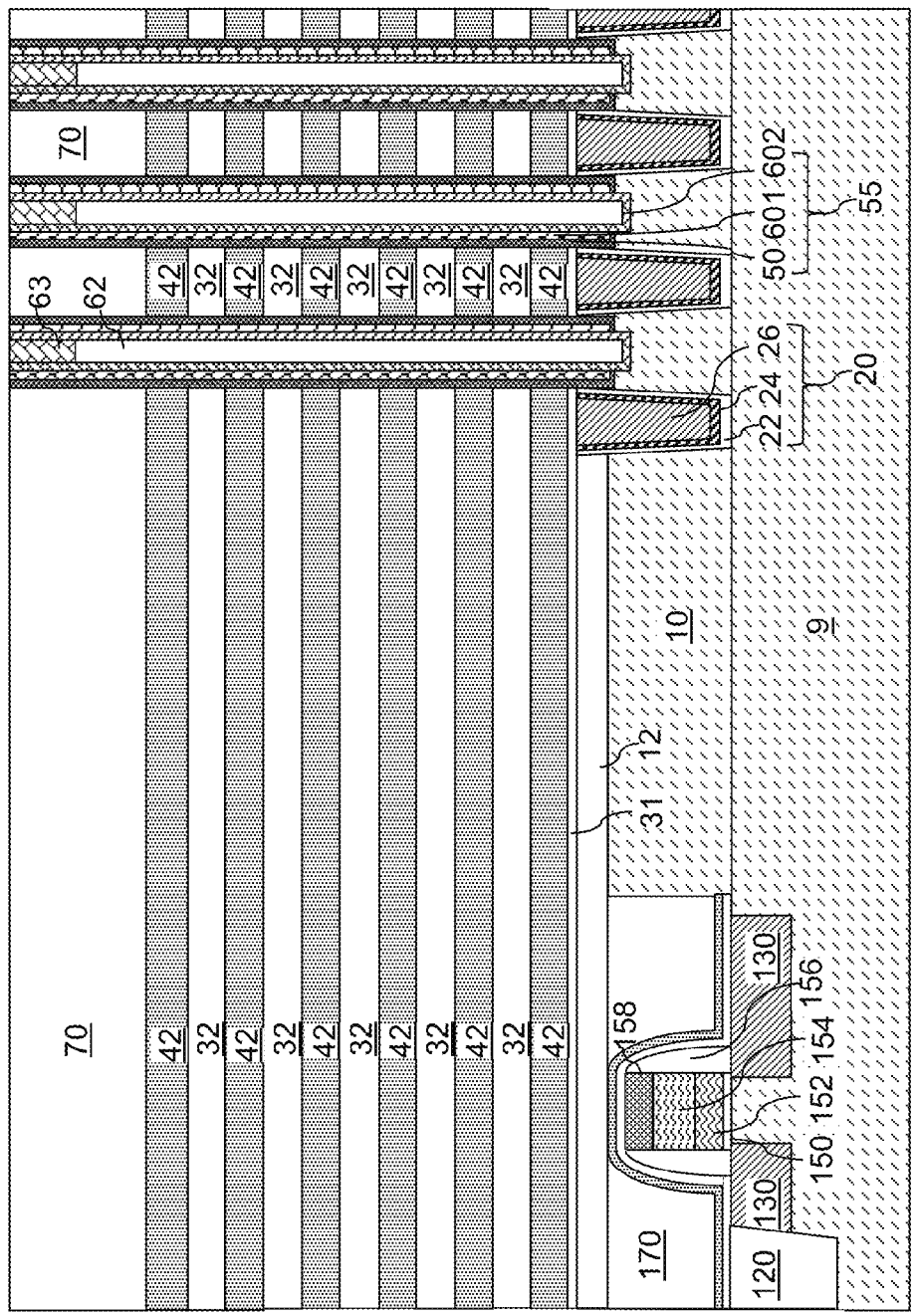
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises at least one blocking dielectric layer 502 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
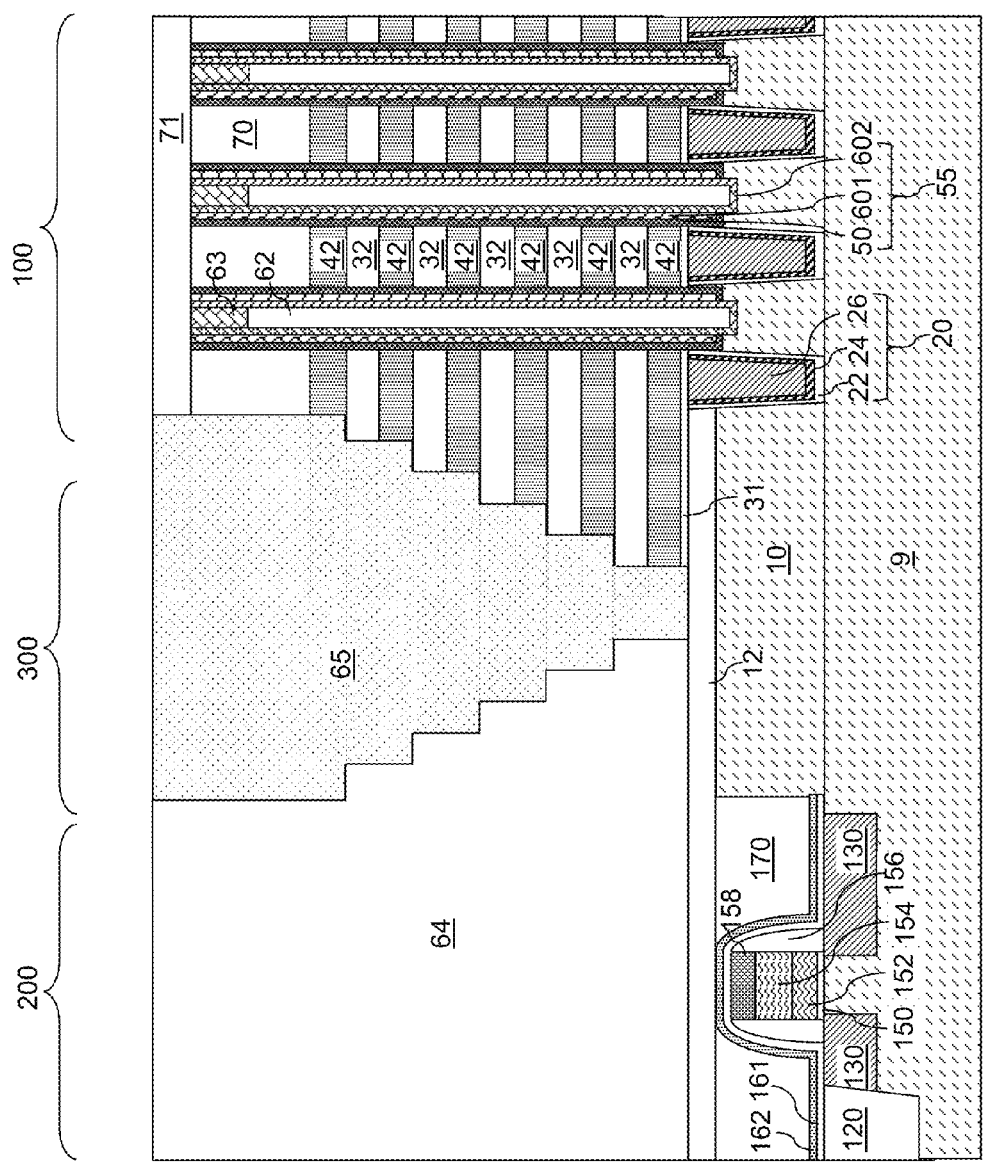
FIG. 4 is a vertical cross-sectional view of the exemplary structure after formation of a stepped terrace and a retro-stepped dielectric material portion according to an embodiment of the present disclosure.

Referring to FIG. 4, at least one dielectric cap layer 71 can be optionally formed over the planarization dielectric layer 70. The at least one dielectric cap layer 71 can include a dielectric material that can be employed as a stopping layer in a subsequent planarization process. In one embodiment, the at least one dielectric cap layer 71 can include a dielectric metal oxide, silicon nitride, a nitrogen-containing organosilicate glass, silicon oxynitride, and/or silicon oxide. The thickness of the at least one dielectric cap layer can be in a range from 10 nm to 300 nm, although lesser and greater thicknesses can also be employed.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
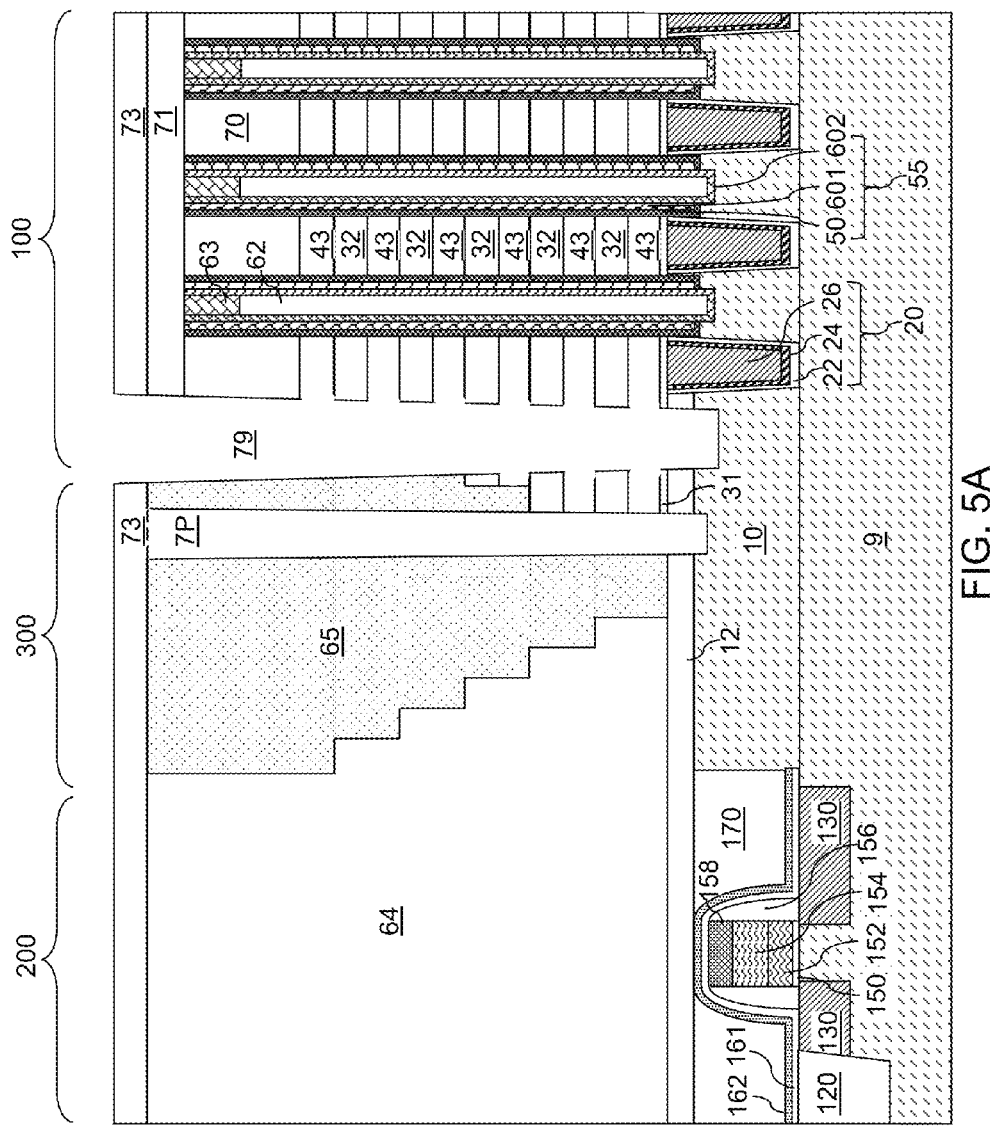
FIG. 5A is a vertical cross-sectional view of the exemplary structure after formation of a backside via cavity and backside recesses according to an embodiment of the present disclosure.
Figure 5B:
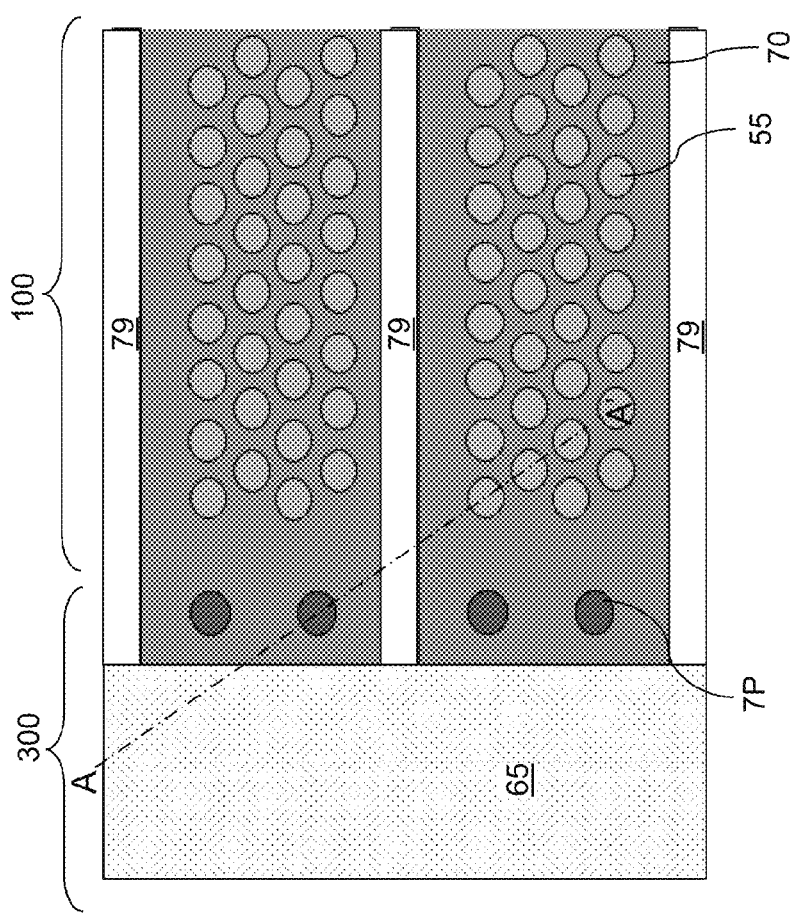
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

Referring to FIG. 6A, a first exemplary memory stack structure within the exemplary structure of FIGS. 5A and 5B is shown. The first exemplary memory stack structure is a first example a unit structure that can be formed within, and around, each memory opening. As discussed above, the etch process that removes the sacrificial material layers 42 can be selective to the outermost layer of the memory film 50, which is the at least one blocking dielectric layer 502. The dielectric material of the at least one blocking dielectric layer 502 may be the same as, or may be different from, the dielectric material of the insulator layers 32. In one embodiment, the at least one blocking dielectric layer 502 can comprise a silicon oxide layer, and the physically exposed sidewalls of the at least one blocking dielectric layer 502 can be silicon oxide surfaces.

Referring to FIG. 6B, after removal of the second material layers (which can be the sacrificial material layers 42), physically exposed portions of the at least one blocking dielectric layer 502 can be etched by an isotropic etch, which can be a wet etch or an isotropic dry etch. Each backside recess 43 can be expanded until sidewalls of the memory material layer 504 are physically exposed to the backside recess 43. The insulator layers 32 may, or may not, be collaterally recessed depending on the compositions of the insulator layers 32 and the at least one blocking dielectric layer 502. In one embodiment, if the insulator layers 32 and the blocking dielectric 502 have different etch characteristics and each backside recess 43 may include an undercut region located between vertically separated remaining portions of the blocking dielectric layer 502. The undercut is located in proximity to the memory material layer 504 and has a greater vertical extent than a distal portion of the backside recess 43 between the insulator layers 32 (i.e., the distal portion of the recess 43 which is laterally spaced from the memory material layer 504 by more than the thickness of the at least one blocking dielectric layer 502). In one embodiment, the insulator layers 32 and the blocking dielectric 502 may comprise silicon oxide materials having different etch characteristics, such as dichlorosilane (DCS, $H_2SiCl_2$) based silicon oxides, disilane (DS, $Si_2H_6$) based silicon oxides, high aspect ratio process (HARP) non-plasma based CVD using TEOS and ozone sources based silicon oxides, high density plasma (HDP) CVD based silicon oxides, tetraethyl orthosilicate (TEOS) based silicon oxides and borosilicate glass (BSG) or borophosphosilicate glass (BPSG). For example, the insulator layers 32 may include plasma enhanced CVD deposited silicon oxide, such as high density plasma (HDP) CVD formed silicon oxide, while the blocking dielectric 502 may include non-plasma CVD or ALD formed silicon oxide, such as high aspect ratio process (HARP) non-plasma based CVD using TEOS and ozone sources based silicon oxides. These silicon oxides have different chemical dry etching (CDE) etch rates.

Referring to FIG. 6C, a plurality of blocking dielectric portions 501 can be formed on the physically exposed surface portions of the memory film 50 (which are the physically exposed surfaces of the memory material layer 504). The plurality of blocking dielectric portions 501 are backside blocking dielectric portions. As used herein, a "backside" blocking dielectric portion refers to a blocking dielectric portion located outside, or at a peripheral portion of, a memory opening. In one embodiment, the plurality of blocking dielectric portions 501 can comprise a material that is different from the material of the memory material layer 504. For example, the plurality of blocking dielectric portions 501 can comprise a dielectric metal oxide, and the memory material layer 504 can comprise silicon nitride. The plurality of blocking dielectric portions 501 can comprise a material (e.g., metal oxide) that is different from a material of the insulator layers 32 and the blocking dielectric layer 502 (e.g., silicon oxide).

As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the plurality of blocking dielectric portions 501 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The plurality of blocking dielectric portions 501 can be deposited, for example, by chemical vapor deposition (CVD), atomic layer deposition (ALD), pulsed laser deposition (PLD), liquid source misted chemical deposition, or a combination thereof. The plurality of blocking dielectric portions 501 can subsequently function as a dielectric material portion that blocks leakage of stored electrical charges to control gate electrodes. In one embodiment, the plurality of blocking dielectric portions 501 includes aluminum oxide.

In one embodiment, the material of the memory material layer 504 can have a different hydrophobicity than the material of the insulator layers 32. In one embodiment, the material of the memory material layer 504 can be silicon nitride, and the material of the insulator layers 32 can be silicon oxide. In this case, the plurality of blocking dielectric portions 501 can be formed between the memory film 50 and a respective remaining portion of a backside recess 43 (which is subsequently filled with an electrically conductive layer) by a selective deposition process that does not grow the dielectric metal oxide on the first material layers (i.e., the insulator layers 32).

The deposition process for the dielectric metal oxide of the plurality of blocking dielectric portions 501 can be a selective deposition process that proceeds on the surfaces of the memory material layer 504, and does not proceed on the surfaces of the insulator layers 32. If a chemical vapor deposition (CVD) process is employed to deposit the dielectric metal oxide, the selective deposition process can be based on differences in the incubation time for deposition of the dielectric oxide material, which can be caused by the differences in the hydrophobicity between the surface of the memory material layer 504 and the surfaces of the insulator layers 32. Incubation time refers to the time that a surface needs to be exposed to a reactant gas before deposition of a material derived from decomposition of the reactant gas can commence. The incubation time for each surface corresponds to a nucleation time, which is the time necessary to nucleate islands of non-volatile dielectric metal oxide compound from the reactant gas. The incubation time is a function of the nature of the surface on which the nucleation proceeds, and can be a function of the reactant gas.

Alternately, if atomic layer deposition (ALD) process is employed to deposit the dielectric metal oxide, the selective deposition process can be based on differences in the number of cycles to form a dielectric metal oxide nucleation layer between a more hydrophobic surface of the memory material layer 504 and a less hydrophobic surface of the insulator layers 32. The minimum number of ALD cycles needed to nucleate islands of non-volatile dielectric metal oxide from the combination of gases provided during the ALD cycles is a function of the nature of the surface, and can be a function of the reactant gases supplied during the ALD process.

In one embodiment, the duration of exposure to the reactant gas in a CVD process or the number of cycles in an ALD process can be selected such that the dielectric metal oxide does not grow from the surfaces of the insulator layers 32, and grows from the physically exposed surfaces of the memory material layer 504. Each of the plurality of blocking dielectric portions 501 is vertically spaced from each other, comprises a dielectric metal oxide having a dielectric constant greater than 7.9, and contacts a respective portion of an outer sidewall of the memory film 50.

The at least one blocking dielectric layer 502 includes a plurality of dielectric material portions that are vertically spaced apart by the plurality of backside dielectric material portions 501. The plurality of backside dielectric material portions 501 is vertically spaced apart from one another by the portions of the at least one blocking dielectric layer 502, i.e., by the plurality of dielectric material portions that constitute the at least one blocking dielectric layer 502. The plurality of dielectric material portions of the at least one blocking dielectric layer 502 and the plurality of blocking dielectric portions 501 collectively constitute an alternating stack of annular structures (501, 502). In one embodiment, the plurality of dielectric material portions within the at least one blocking dielectric layer 502 can include silicon oxide, and the plurality of backside dielectric material portions 501 can include a dielectric metal oxide. In one embodiment, in case undercuts are formed within backside cavities at the processing step of FIG. 6B, each dielectric material portion among the plurality of dielectric material portions of the at least one blocking dielectric layer 502 can have a lesser vertical extent than the insulator layer 32 that contacts the dielectric material portion. In one embodiment, in case undercuts are formed within backside cavities at the processing step of FIG. 6B, a blocking dielectric portion 501 can have a greater vertical extent than the electrically conductive layer to be subsequently formed directly on the blocking dielectric portion 501.

Figure 11:
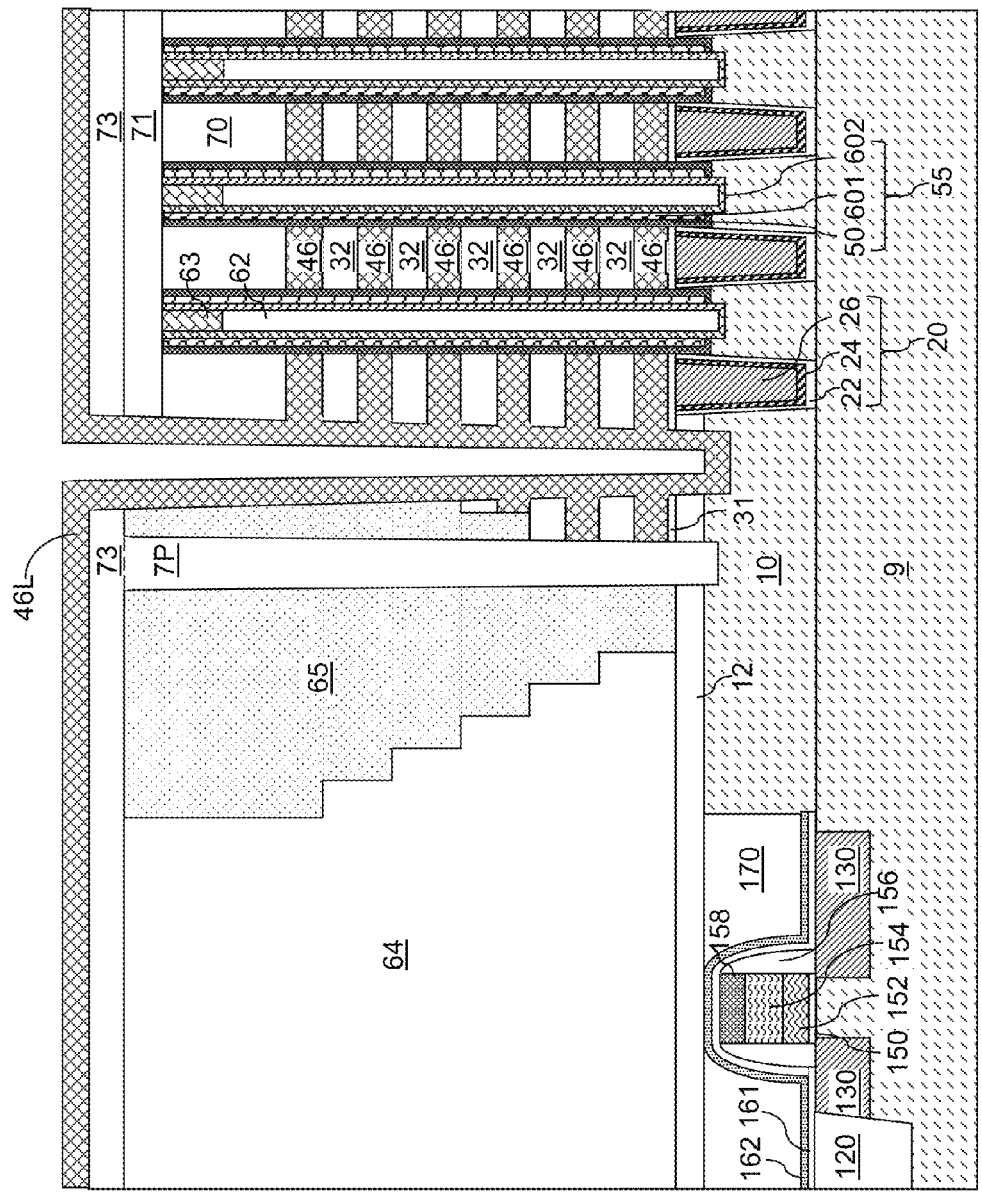
FIG. 11 is a vertical cross-sectional view of the exemplary structure after formation of the electrically conductive lines according to an embodiment of the present disclosure.

Referring to FIGS. 6D and 11, at least one conductive material can be deposited in the plurality of backside recesses 43, on sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. The at least one conductive material is deposited directly on horizontal surfaces of the insulator layers 32 and on the outer sidewalls of the plurality of blocking dielectric portions 501.

In one embodiment, the at least one conductive material can comprise a metal such as tungsten and/or metal nitride. In one embodiment, the at least one conductive material for filling the plurality of backside recesses 43 can be selected from tungsten and a combination of titanium nitride and tungsten. In one embodiment, the at least one conductive material can be deposited by chemical vapor deposition. In one embodiment, the at least one conductive can include a first conductive material comprising a conductive metallic nitride and a second conductive material comprising an elemental metal or an alloy of at least two elemental metals. In this case, the deposited conductive material layers can include a metallic liner 46A comprising the first conductive material and a metallic fill material layer 46B comprising the second conductive material. In one embodiment, the metallic liner 46A can include titanium nitride, and the metallic fill material layer 46B can comprise tungsten.

A combination of a portion of the metallic liner 46A and a portion of the metallic fill material layer 46B that fills each backside recess 43 constitutes an electrically conductive layer 46. A plurality of electrically conductive layers 46 can be formed in the plurality of backside recesses 43, and a contiguous conductive material layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each sacrificial material layer 42 can be replaced with an electrically conductive layer 46, which is a conductive material portion.

Each of the plurality of blocking dielectric portions 501 contacts a sidewall of a respective electrically conductive layer 46 and at least one horizontal surface of the insulator layers 32. An electrically conductive layer 46 can contact a horizontal bottom surface of an overlying insulator layer 32 and a horizontal top surface of an underlying insulator layer 32, and outer sidewall of a blocking dielectric portion 501. Multiple instances of the first exemplary memory stack structure illustrated in FIG. 6D can be incorporated into the exemplary structure of FIG. 11 as an array.

Alternatively, multiple instances of a second exemplary memory stack structure can be formed in lieu of forming multiple instances of the first exemplary memory stack structure illustrated in FIG. 6D in the exemplary structure of FIG. 11. Referring to FIG. 7A, a second exemplary memory stack structure can be derived from the first exemplary memory stack structure illustrated in FIG. 6A by depositing a deposition inhibitor material layer 33 selectively on surfaces of the first material layers (i.e., the insulator layers 32) while the deposition inhibitor material layer is not formed on the physically exposed surface portions of the memory film 50. The deposition inhibitor material layer 33 comprises a material that suppresses deposition of the dielectric material of the plurality of blocking dielectric portions 501.

The deposition inhibitor material layer 33 can include molecules that display growth instability on a hydrophobic surface (such as a silicon nitride surface), and forms a contiguous film without openings on a hydrophilic surface (such as a silicon oxide surface). The deposition inhibitor molecular layer may comprise one or more self-assembled monolayers. The molecules of the deposition inhibitor material layer 33 can be a molecule with a first protruding end portion (e.g., head group) and a second protruding end portion (e.g., terminal group) that are located on opposite sides of an optional middle portion. The first protruding end portion includes a group that is selectively attached to hydroxyl group terminated surfaces (i.e., —OH terminated surfaces, such as silicon oxide surfaces), while not attaching to hydrogen terminated surfaces (such as silicon nitride surfaces having —H termination) after native oxide removal by $NH_4F$. The second protruding end portion includes a meal oxide deposition inhibitor group. The optional middle portion may include an alkyl chain. The Van der Waals interactions between these chains cause the self-assembled monolayers to be ordered. The thickness of the deposition inhibitor material layer 33 can be the thickness of a monolayer of the deposition inhibitor material.

An exemplary material that can be employed for the deposition inhibitor material layer 33 is hexamethyldisilazane (HMDS) having a formula $[(CH_3)_3Si]_2NH$. Another exemplary material that can be employed for the deposition inhibitor material layer 33 is octadecyldimethylchlorosilane (ODMS). Further, alkyl trichlorosilanes ($CH_3$—$(CH_2)_n$—$SiCl_3$) in which n indicates the chain length can be employed as the self-aligning material for the deposition inhibitor material layer 33. Aluminum oxide blocking dielectric portions 501 may be selectively formed on the exposed silicon nitride portions 504 by ALD using trimethylaluminum (TMAl) and $H_2O$ precursors. Such ALD formed aluminum oxide exhibits a growth instability (i.e., does not initially grow) on a deposition inhibitor material layer 33 having $CH_3$ terminal groups, such as HMDS or ODMS.

Referring to FIG. 7B, the processing step of FIG. 6C can be performed to form a plurality of blocking dielectric portions 501 on the physically exposed surface portions of the memory film 50 (which are the physically exposed surfaces of the memory material layer 504). In one embodiment, the plurality of blocking dielectric portions 501 can comprise a material that is different from the material of the memory material layer 504. For example, the plurality of blocking dielectric portions 501 can comprise a dielectric metal oxide, and the memory material layer 504 can comprise silicon nitride. The plurality of blocking dielectric portions 501 can comprise a material that is different from a material of the insulator layers 32.

In one embodiment, the duration of exposure to the reactant gas in a CVD process or the number of cycles in an ALD process can be selected such that the dielectric metal oxide does not grow from the deposition inhibitor material layer 33 covered surfaces of the insulator layers 32, and grows from the physically exposed surfaces of the memory material layer 504. Each of the plurality of blocking dielectric portions 501 is vertically spaced from each other, comprises a dielectric metal oxide having a dielectric constant greater than 7.9, and contacts a respective portion of an outer sidewall of the memory film 50. The deposition inhibitor material layer 33 may be left as is, or can be volatilized during the deposition process for the plurality of blocking dielectric portions 501, or may be removed after formation of the plurality of blocking dielectric portions 501 by a clean process.

Subsequently, the processing steps of FIG. 6D can be performed to provide the exemplary structure illustrated in FIG. 11.

Alternatively, multiple instances of a third exemplary memory stack structure can be formed in lieu of first or second exemplary memory stack structures in the exemplary structure of FIG. 11. Referring to FIG. 8A, a third exemplary memory stack structure can be derived from the second exemplary memory stack structure illustrated in FIG. 7A by selecting the deposition inhibitor material of the deposition inhibitor material layer 33 such that the coverage of the deposition inhibitor material layer 33 is affected by properties of underlying and/or neighboring surfaces. In other words, coverage of the deposition inhibitor material of the deposition inhibitor material layer 33 depends on the surface property of the location at which a molecule of the deposition inhibitor material is present and/or on the properties of neighboring surfaces. For example, the deposition inhibitor material layer 33 is selectively deposited on the insulator layers 32 but is not deposited on the exposed edge surfaces of the blocking dielectric layer 502 and/or is not deposited near the silicon nitride regions 504. Without wishing to be bounded by a particular theory, coverage of many deposition inhibitor materials may be affected by the depth of the backside recess 43 or surface properties of neighboring surfaces due to a finite volume of the molecules of the deposition inhibitor molecules, although the degree to which the properties of neighboring surfaces affect the coverage of the deposition inhibitor material molecule at a location varies from material to material. If the coverage of the deposition inhibitor materials that attaches predominantly to hydrophilic surfaces (such as the surfaces of the insulator layers 32 that include silicon oxide) is significantly affected by the surface properties of neighboring surfaces, and if a hydrophobic surface (such as the outer sidewalls of the memory material layer 504 that can be a silicon nitride surface) is present nearby, the deposition inhibitor material layer 33 may be thin, or absent, near the hydrophobic surfaces.

Referring to FIG. 8B, the processing step of FIG. 6C can be subsequently performed. The absence of the deposition inhibitor material layer 33 on the blocking dielectric layer 502 edge surfaces and/or near the hydrophobic surfaces of the memory material layer 504 induces deposition of the dielectric metal oxide material at an upper corner portion and at a lower corner portion of each backside recess 43 in proximity to the memory material layer 504. A plurality of blocking dielectric portions 501 is formed on physically exposed surface portions of the memory film 50. Each blocking dielectric portion 501 can include a vertical portion, an upper laterally-protruding portion that protrudes outward from an outer sidewall of the vertical portion, and a lower laterally-protruding portion that protrudes outward from the outer sidewall of the vertical portion. In one embodiment, the upper laterally-protruding portion and the lower laterally-protruding portion can have a variable thickness that decreases with distance from the memory material layer 504. Each of the lower and upper laterally-protruding portion can have a shape of an annular disc, of which the inner periphery is adjoined to a vertical portion of the blocking dielectric portion 501 and the outer periphery is concave.

The plurality of blocking dielectric portions 501 can be vertically spaced from each other, can comprise dielectric metal oxide having a dielectric constant greater than 7.9, and can contact a respective portion of an outer sidewall of the memory film 50. Each of the plurality of blocking dielectric portions 501 can contact at least one horizontal surface of the insulator layers 32. The plurality of blocking dielectric portions 501 can comprise a material that is different from a material of the insulator layers 32. The material of the memory material layer 504 can have a greater hydrophobicity than the material of the insulator layers 32.

The blocking dielectric layer 502 can include a plurality of dielectric material portions that are vertically spaced apart, comprising a different material than the plurality of blocking dielectric portions 501, which contacts an overlying blocking dielectric portion 502 and an underlying blocking dielectric portion 502. Each of the plurality of dielectric material portions 502 can contact a sidewall of a respective insulator layer 32. The plurality of dielectric material portions of the blocking dielectric layer 502 and the plurality of blocking dielectric portions 501 can constitute an alternating stack of annular structures (501, 502).

Subsequently, the processing steps of FIG. 6D can be performed to provide the third exemplary memory structure illustrated in FIG. 8C, multiple instances of which can be incorporated into the exemplary structure illustrated in FIG. 11.

Alternatively, multiple instances of a fourth exemplary memory stack structure can be formed in lieu of forming multiple instances of the first, second, or third exemplary memory stack structures in the exemplary structure of FIG. 11. Referring to FIG. 9A, a fourth exemplary memory stack structure can be derived from the first exemplary memory stack structure illustrated in FIG. 6A by depositing a deposition promoter material layer 37 selectively on surfaces of the physically exposed surface portions of the memory film 50 while the deposition promoted material layer is not formed on the first material layers (i.e., the insulator layers 32). The deposition promoter material layer 37 comprises a material that promotes deposition of the dielectric material of the plurality of blocking dielectric portions 501. Optionally, both the deposition promoter 37 and inhibitor 33 layers may be present in the same device, with the promoter layer 37 located on the silicon nitride layer 504 of the memory film 50 and the inhibitor layer 33 located on the insulator layers 32.

The deposition promoter material layer 37 can include molecules that displays growth instability on a hydrophilic surface (such as a silicon oxide surface), and forms a contiguous film without openings on a hydrophobic surface (such as a silicon nitride surface). The molecules of the deposition promoter material layer 37 can be a molecule with a first protruding end portion (head group) and a second protruding end portion (terminal group) that are located on opposite sides. The first protruding end portion includes a head group that can be attached to hydrogen terminated surfaces (such as silicon nitride surfaces having —H termination), while not attaching to hydroxyl group terminated surfaces (i.e., —OH terminated surfaces, such as silicon oxide surfaces). The second protruding end portion includes a metal oxide deposition promoter terminal group. Any alkene self-aligning material that bonds to hydrogen terminated $SiN_x$ can be modified or functionalized to have a terminal group such as —SH (thiol) or —$NH_2$ (amine). Such functionalized alkene self-aligning material can have good affinity and adhesion to metal layers, and therefore, can permit selective deposition of high-k dielectric material layers such as aluminum oxide or hafnium oxide.

The thickness of the deposition promoter material layer 37 can be the thickness of a monolayer of the deposition promoter material.

Referring to FIG. 9B, the processing step of FIG. 6C can be performed to form a plurality of blocking dielectric portions 501 on the physically exposed deposition promoter 37 covered surface portions of the memory film 50 (which are the physically exposed surfaces of the memory material layer 504). In one embodiment, the plurality of blocking dielectric portions 501 can comprise a material that is different from the material of the memory material layer 504. For example, the plurality of blocking dielectric portions 501 can comprise a dielectric metal oxide, and the memory material layer 504 can comprise silicon nitride. The plurality of blocking dielectric portions 501 can comprise a material that is different from a material of the insulator layers 32, which can be, for example, silicon oxide.

In one embodiment, the duration of exposure to the reactant gas in a CVD process or the number of cycles in an ALD process can be selected such that the dielectric metal oxide does not grow from the surfaces of the insulator layers 32, and grows from the physically exposed deposition promoter 37 covered surfaces of the memory material layer 504. Each of the plurality of blocking dielectric portions 501 is vertically spaced from each other, comprises a dielectric metal oxide having a dielectric constant greater than 7.9, and contacts a respective portion of an outer sidewall of the memory film 50. The deposition promoter material layer 37 may be left as is, or can be volatilized during the deposition process for the plurality of blocking dielectric portions 501, or may be removed after formation of the plurality of blocking dielectric portions 501 by a clean process.

Subsequently, the processing steps of FIG. 6D can be performed to provide the exemplary structure illustrated in FIG. 11.

Alternatively, multiple instances of a fifth exemplary memory stack structure can be formed in lieu of first, second, third, or fourth exemplary memory stack structures in the exemplary structure of FIG. 11. Referring to FIG. 10A, a fifth exemplary memory stack structure can be derived from the fourth exemplary memory stack structure illustrated in FIG. 9A by selecting the deposition promoter material of the deposition promoter material layer 37 such that the coverage of the deposition promoter material layer 37 is affected by properties of underlying and/or neighboring surfaces. In other words, coverage of the deposition inhibitor material of the deposition promoter material layer 37 depends on the surface property of the location at which a molecule of the deposition promoter material is present and/or on the properties of neighboring surfaces. If the coverage of the deposition promoter materials that attaches predominantly to hydrophobic surfaces (such as the outer sidewalls of the memory material layer 504 that can be a silicon nitride surface) is significantly affected by the surface properties of neighboring surfaces, and if a hydrophilic surface is (such as the surfaces of the insulator layers 32 or the blocking dielectric layer 502 that include silicon oxide) present nearby, the deposition promoter material layer 37 may be extend over peripheral portions of neighboring hydrophilic surfaces such as inner portions of the insulator layers 32 and/or the blocking dielectric layer 502 that include silicon oxide.

Referring to FIG. 10B, the processing step of FIG. 6C can be subsequently performed. The presence of the deposition promoter material layer 37 at inner portions of the hydrophilic surfaces of the insulator layers 32 induces deposition of the dielectric metal oxide material at an upper corner portion and at a lower corner portion of each backside recess 43 in proximity to the memory material layer 504. A plurality of blocking dielectric portions 501 is formed on physically exposed surface portions of the memory film 50 and the exposed edges of the blocking dielectric layer 502. Each blocking dielectric portion 501 can include a vertical portion, an upper laterally-protruding portion that protrudes outward from an outer sidewall of the vertical portion, and a lower laterally-protruding portion that protrudes outward from the outer sidewall of the vertical portion. In one embodiment, the upper laterally-protruding portion and the lower laterally-protruding portion formed on the exposed edges of the blocking dielectric layer 502 can have a variable thickness that decreases with distance from the memory material layer 504. Each of the lower and upper laterally-protruding portions can have a shape of an annular disc, of which the inner periphery is adjoined to a vertical portion of the blocking dielectric portion 501 and the outer periphery is concave.

The plurality of blocking dielectric portions 501 can be vertically spaced from each other, can comprise dielectric metal oxide having a dielectric constant greater than 7.9, and can contact a respective portion of an outer sidewall of the memory film 50. Each of the plurality of blocking dielectric portions 501 can contact at least one horizontal surface of the insulator layers 32. The plurality of blocking dielectric portions 501 can comprise a material that is different from a material of the insulator layers 32. The material of the memory material layer 504 can have a greater hydrophobicity than the material of the insulator layers 32.

The blocking dielectric layer 502 can include a plurality of dielectric material portions that are vertically spaced apart, comprising a different material than the plurality of blocking dielectric portions 501, and contacting an overlying blocking dielectric portion 502 and an underlying blocking dielectric portion 502. Each of the plurality of dielectric material portions 502 can contact a sidewall of a respective insulator layer 32. The plurality of dielectric material portions of the blocking dielectric layer 502 and the plurality of blocking dielectric portions 501 can constitute an alternating stack of annular structures (501, 502).

Subsequently, the processing steps of FIG. 6D can be performed to provide the third exemplary memory structure illustrated in FIG. 10C, multiple instances of which can be incorporated into the exemplary structure illustrated in FIG. 11.

Referring to FIGS. 6D, 7B, 8C, 9B, 10C, and 11, the plurality of blocking dielectric portions 501 comprising the dielectric metal oxide is formed between the memory film 50 and the respective electrically conductive layers 46 by a selective deposition process that does not grow the dielectric metal oxide on the first material layers, i.e., the insulator layers 32.

In one embodiment, a chemical layer including self-assembled monolayer(s) and/or chemical and/or plasma treatment may be employed to selectively modify hydrophobicity and/or hydrophilicity of the memory material layer 504 and/or the insulator layers 32. Generally, the difference in the hydrophobicity between the surfaces of the insulator layers 32 and the surfaces of the memory material layer 504 can be increased by a surface treatment that selectively forms a chemical deposition inhibitor layer on the insulator layers 32 while not forming a chemical layer on the memory material layer, or by a surface treatment that selectively forms a chemical deposition promoter layer on the physically exposed portions of the memory material layer 504 while not forming a chemical layer on the insulator surfaces 32. The differences in the hydrophobicity can be employed to form a plurality of blocking dielectric portions 501 selectively over the memory material layer 504 portions exposed in the recesses 43 without depositing the dielectric material of the plurality of blocking dielectric portions 501 on the surfaces of the insulator layers 32. If an atomic layer deposition (ALD) process that deposits the material of the plurality blocking dielectric material portions 501 is a process that inherently has a lesser incubation time on hydrophobic surfaces than on hydrophilic surfaces, a selective surface treatment on the memory material layer 504 and/or a surface treatment on the insulator layers 32 cause the surfaces of the memory material layer 504 to become more hydrophobic relative to the surfaces of the insulator layers 32 after the surface treatment(s). If an ALD process that deposits the material of the plurality blocking dielectric material portions 501 is a process that inherently has a lesser incubation time on hydrophilic surfaces than on hydrophobic surfaces, a selective surface treatment on the memory material layer 504 and/or a surface treatment on the insulator layers 32 cause the surfaces of the memory material layer 504 to become more hydrophilic relative to the surfaces of the insulator layers 32 after the surface treatment(s).

Figure 12:
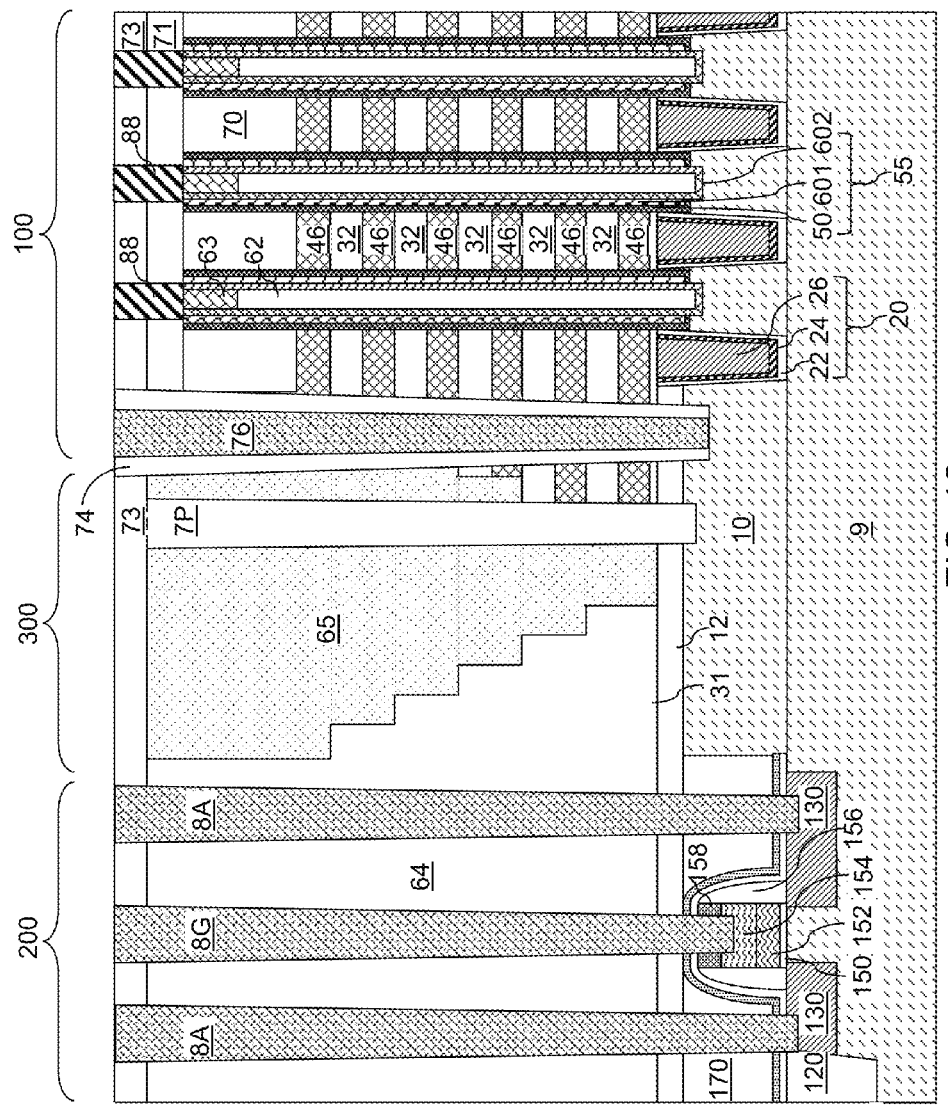
FIG. 12 is a vertical cross-sectional view of the exemplary structure after formation of a backside insulator spacer and a backside contact via structure according to an embodiment of the present disclosure.

Referring to FIG. 12, the deposited conductive material of the contiguous conductive material layer 46L is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures (not shown) can be formed within each contact via cavity that extends to a top surface of the electrically conductive layers 46 in the contact region 300. Similarly, drain contact via structures 88 can be formed to provide electrical contact to the drain regions 63.

Figure 13A:
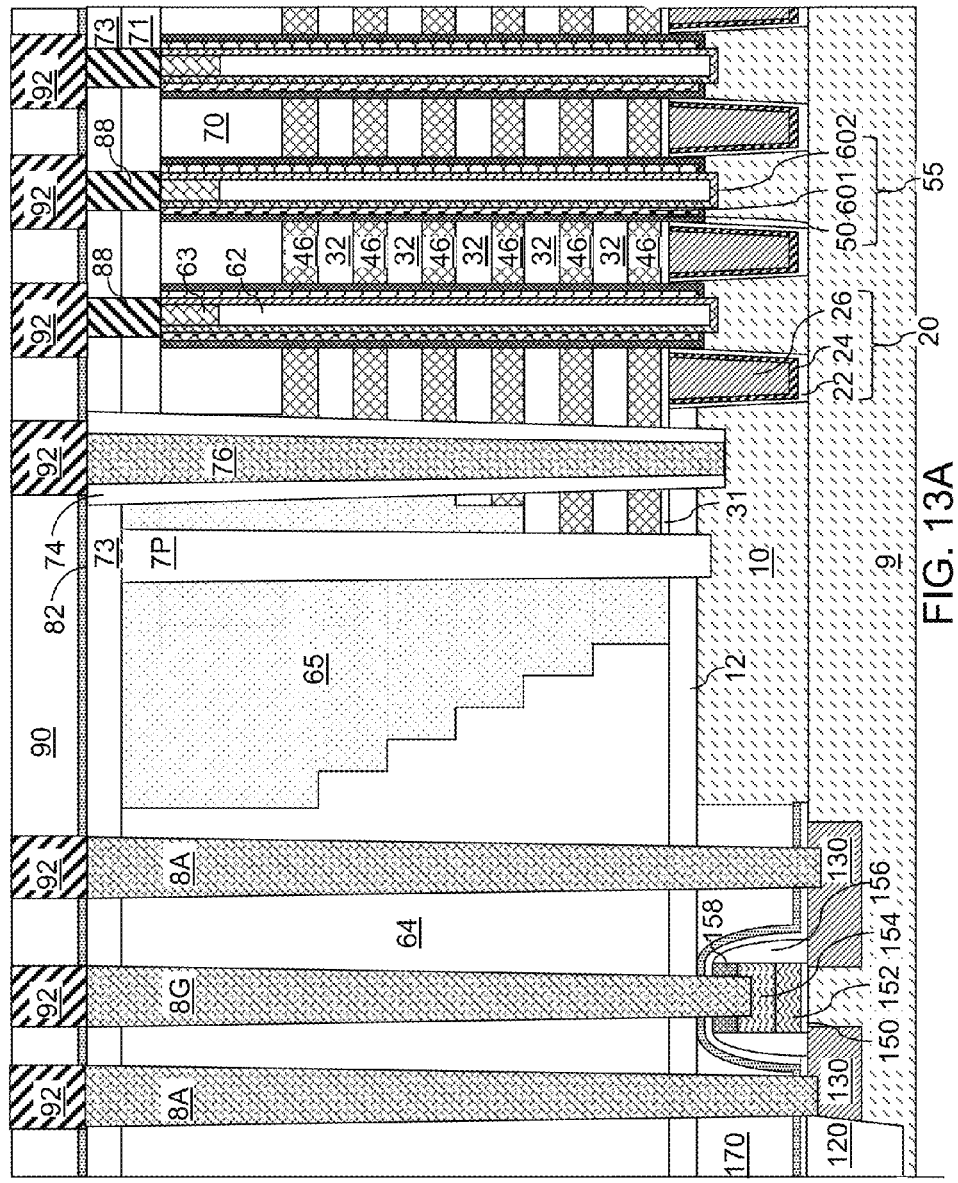
FIGS. 13A and 13B are vertical cross-sectional views of regions of the exemplary structure after formation of conductive line structures according to an embodiment of the present disclosure.
Figure 13B:
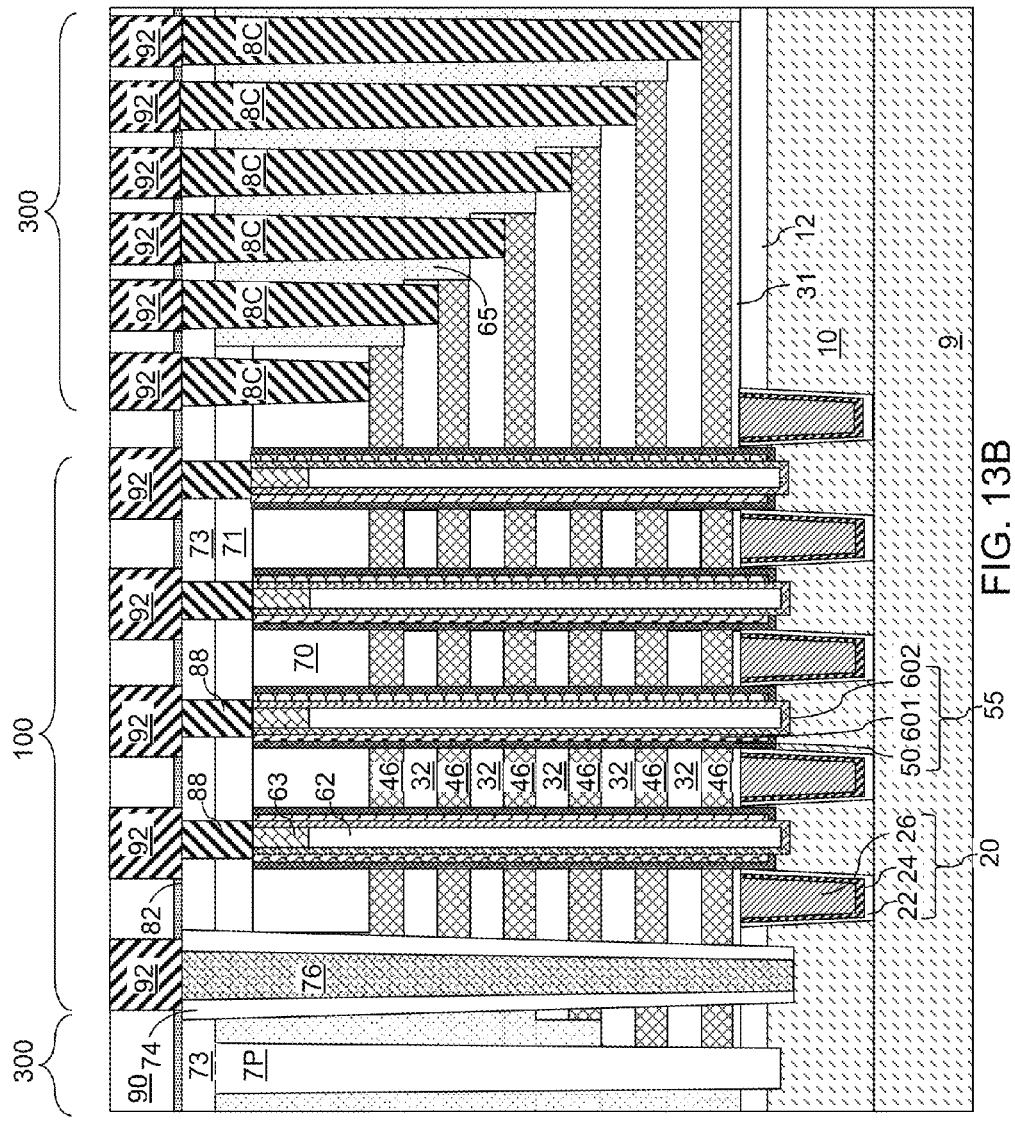

Referring to FIGS. 13A and 13B, an optional passivation layer 82 and a line-level dielectric layer 90 can be formed over the dielectric pillar material layer 73. The optional passivation layer 82 can include a low permeability material such as silicon nitride. As used herein, a low permeability material refers to a material that has a hydrogen permeability at room temperature that is less than 100 times the hydrogen permeability of stoichiometric silicon nitride formed by low pressure chemical vapor deposition. The thickness of the passivation layer 82 can be in a range from 3 nm to 30 nm, although lesser and greater thicknesses can also be employed. The line-level dielectric layer 90 can include silicon oxide or organosilicate glass. The thickness of the line-level dielectric layer 90 can be in a range from 30 nm to 1,000 nm, although lesser and greater thicknesses can also be employed. Control gate contact via structures 8C contact the electrically conductive layers 46.

Various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90. An optional top passivation layer having a low hydrogen permeability can be deposited over the additional metal interconnect structures, if present, or over the line-level dielectric layer 90. In one embodiment, the top passivation layer can include silicon nitride. The thickness of the top passivation layer can be in a range from 3 nm 100 nm, although lesser and greater thicknesses can also be employed. Optionally, openings for making electrical contacts to the conductive line structures 92 or an overlying metal interconnect structure (not shown) may be formed in the top passivation layer.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 200 including a plurality of electrically conductive contact via structures.

In case the exemplary structure includes a three-dimensional NAND device, a stack (32, 46) of an alternating plurality of word lines 46 and insulator layers 32 can be located over a semiconductor substrate. Each of the word lines 46 and insulator layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulator layers 32 can comprise silicon oxide layers, the plurality of word lines 46 can comprise tungsten or a combination of titanium nitride and tungsten, the at least one charge storage region can comprises a tunneling dielectric layer, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10.

A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

Figure 14B:
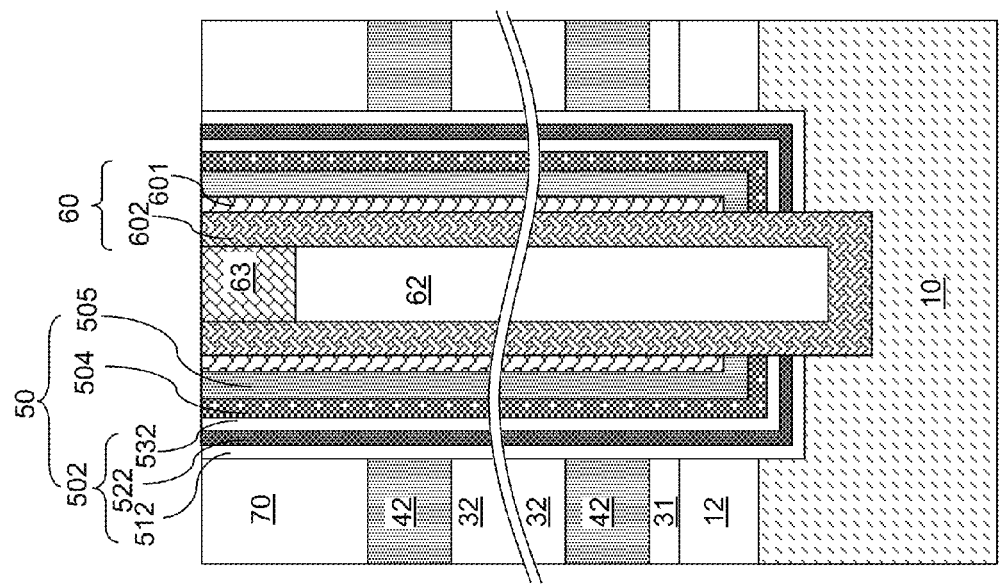
FIGS. 14A and 14B are sequential vertical cross-sectional views of a memory opening within the exemplary structure during various processing steps employed to form a sixth exemplary memory stack structure according to an embodiment of the present disclosure.
Figure 14A:
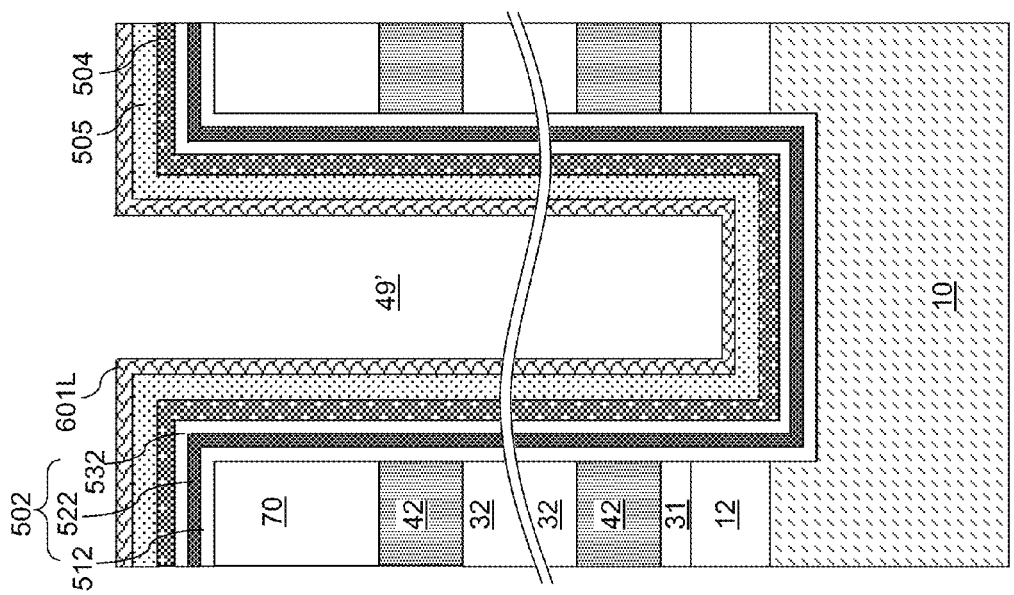

Referring to FIG. 14A, an in-process sixth exemplary memory stack structure is illustrated, which can be formed in the memory opening illustrated in FIG. 2A by depositing a lateral stack of material layers as illustrated in FIG. 2B. Specifically, the at least one blocking dielectric layer 502 comprises an outer blocking dielectric layer 512 that is deposited first, an intermediate blocking dielectric layer 522 that is deposited second, and an inner blocking dielectric layer 532 that is deposited third. As used herein, an "in-process" structure refers to a structure that is present during a processing step of a manufacturing process, and may, or may not, be modified during subsequent processing steps. In one embodiment, the outer blocking dielectric layer 512 can be a silicon oxide layer having a thickness in a range from 0.5 nm to 6 nm, the intermediate blocking dielectric layer 522 can be a silicon nitride layer having a thickness in a range from 0.5 nm to 6 nm, and the inner blocking dielectric layer 532 can be a silicon oxide layer having a thickness in a range from 0.5 nm to 6 nm.

Thereafter, the processing steps of FIGS. 2C-2F can be performed to provide the sixth exemplary memory stack structure illustrated in FIG. 14B. The processing steps of FIGS. 4, 5A and 5B are subsequently performed. The exemplary structure at the end of the processing steps of FIGS. 5A and 5B include multiple instances of the sixth exemplary memory stack structure illustrated in FIG. 15A. In one embodiment, the etch process that removes the sacrificial material layers 42 can be selective to the dielectric material of the outer blocking layer 512.

Referring to FIG. 15B, physically exposed portions of the outer blocking dielectric layer 512 can be etched by an isotropic etch, which can be a wet etch or an isotropic dry etch. The etch process that etches the outer blocking dielectric layer 512 can be selective to the dielectric material of the intermediate blocking dielectric material layer 522, which includes a different dielectric material than the outer dielectric material layer 512. Each backside recess 43 can be expanded until sidewalls of the intermediate blocking dielectric material layer 522 are physically exposed to the backside recess 43. In one embodiment, the material of the intermediate blocking dielectric layer 522 has a greater hydrophobicity than the material of the insulator layers 32. In one embodiment, the intermediate blocking dielectric layer 522 can be a silicon nitride layer, and the insulator layers 32 can be silicon oxide layers.

The insulator layers 32 may, or may not, be collaterally recessed depending on the compositions of the insulator layers 32 and the at least one blocking dielectric layer 502. In one embodiment, each backside recess 43 may include an undercut region located between remaining portions of layer 512 in proximity to the memory material layer 504 and having a greater vertical extent than a distal portion of the backside recess 43 laterally spaced from the intermediate blocking dielectric layer 522 by more than the thickness of the outer blocking dielectric layer 512.

Referring to FIG. 15C, the processing steps of FIG. 6C, the processing steps of FIGS. 7A and 7B, and the processing steps of FIGS. 9A and 9B can be performed to form a plurality of blocking dielectric portion 501.

Referring to FIG. 15D, the processing steps of FIG. 6D can be performed to form electrically conductive layers 46 in the backside recesses 43. Multiple instances of the sixth exemplary memory stack structure can be incorporated into the exemplary structure illustrated in FIG. 11, and the processing steps of FIGS. 12, 13A, and 13B can be subsequently performed.

Figure 8C:
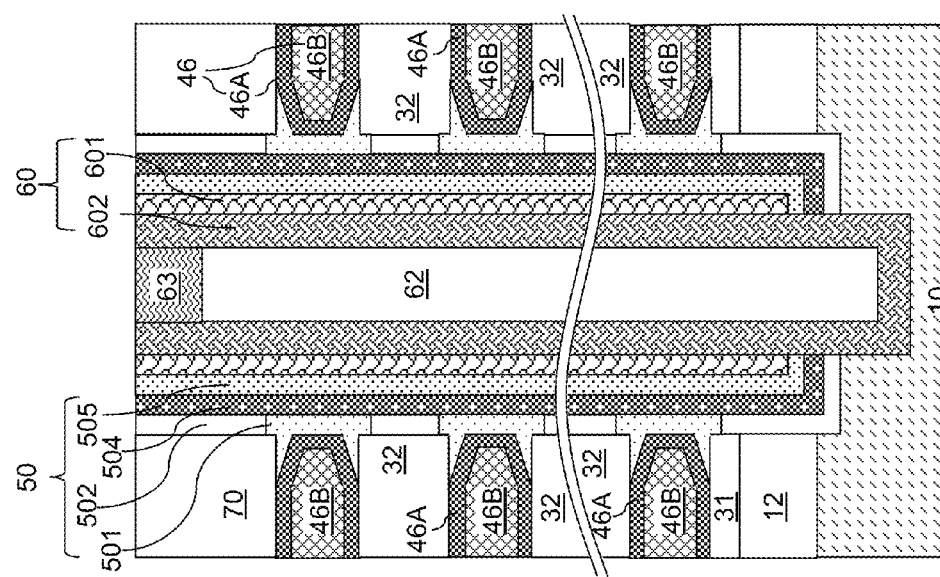
Figure 10C:
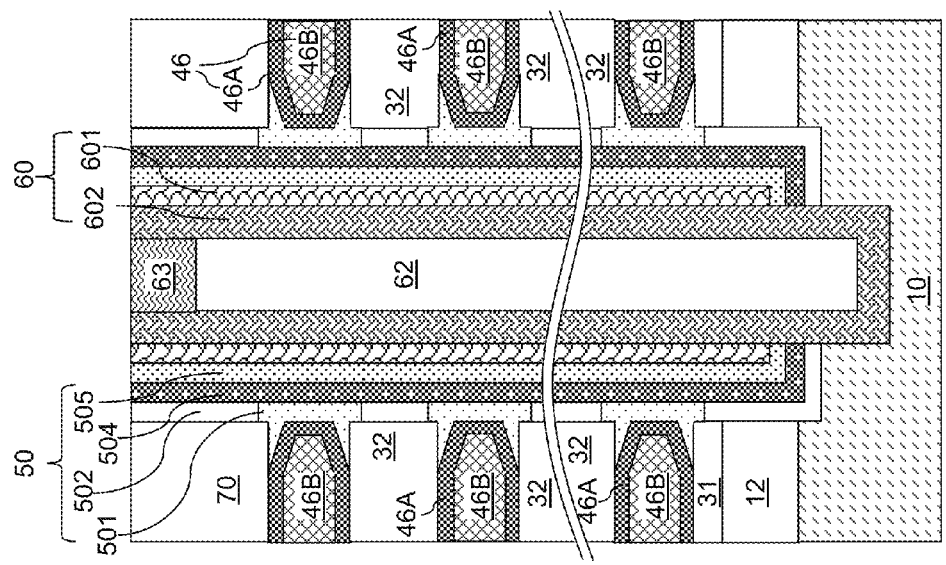
Figure 15E:
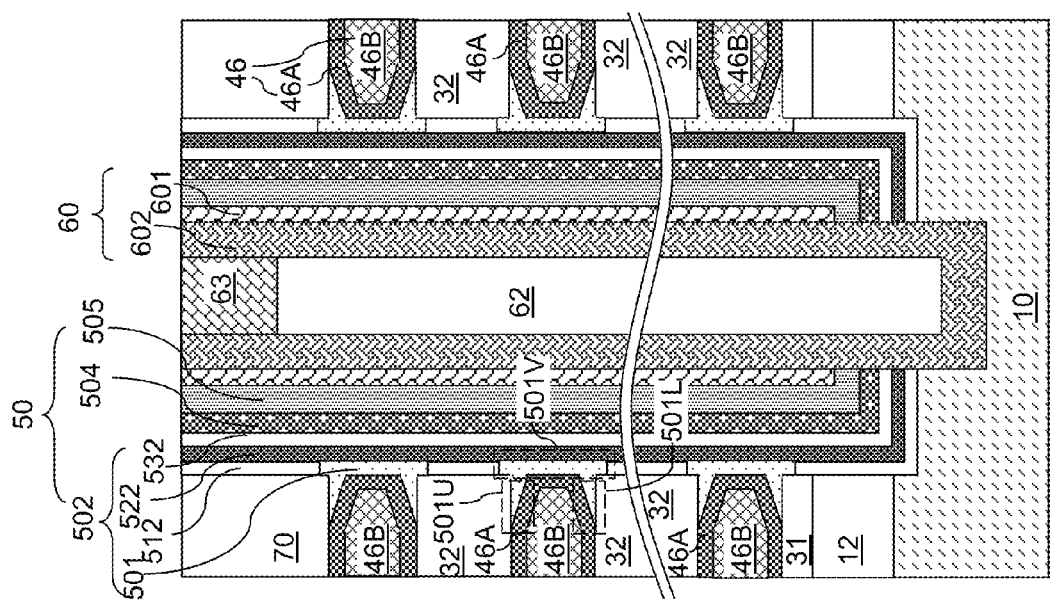
FIG. 15E is a vertical cross-sectional view of an alternate embodiment of the sixth exemplary memory stack structure according to an embodiment of the present disclosure.

Referring to FIG. 15E, an alternate embodiment of the sixth exemplary memory stack structure can be derived from the in-process sixth exemplary memory stack structure illustrated in FIG. 15B by performing the processing steps of FIG. 8A-8C or by performing the processing steps of FIGS. 10A-10C. Multiple instances of the alternate embodiment of the sixth exemplary memory stack structure can be incorporated into the exemplary structure illustrated in FIG. 11, and the processing steps of FIGS. 12, 13A, and 13B can be subsequently performed. In one embodiment, each of the plurality of blocking dielectric portions 501 can comprise a vertical portion, an upper laterally-protruding portion that protrudes outward from an outer sidewall of the vertical portion, and a lower laterally-protruding portion that protrudes outward from the outer sidewall of the vertical portion.

Within each sixth exemplary memory stack structure or an alternate embodiment thereof, a plurality of blocking dielectric portions 501 is vertically spaced from each other, comprises dielectric metal oxide having a dielectric constant greater than 7.9, and contacts a respective portion of an outer sidewall of the intermediate blocking dielectric layer 522 and a sidewall of a respective electrically conductive layer 46. Each of the plurality of blocking dielectric portions 501 contacts at least one horizontal surface of the insulator layers 32.

The plurality of blocking dielectric portions 501 comprises a dielectric metal oxide, and is formed between the memory film 504 and the respective electrically conductive layers 46 by a selective deposition process that does not grow the dielectric metal oxide from the first material layers, i.e., the insulator layers 32.

Referring to FIG. 16A, an in-process seventh exemplary memory stack structure is illustrated, which can be derived from the in-process first exemplary memory stack structure illustrated in FIG. 2A by performing a selective isotropic etch process. Specifically, after formation of a memory opening 49 through the alternating stack (32, 42), the selective isotropic etch process is performed to etch the second material of the sacrificial material layers 42 with respect to the first material of the insulator layers 32. Sidewalls of the second material layers (i.e., the sacrificial material layers 42) are laterally recessed with respect to sidewalls of the first material layers (i.e., the insulator layers 32). In one embodiment, the lateral recess distance between a sidewall of a sacrificial material layer 42 and a sidewall of an insulator layer 32 can be in a range from 1 nm to 12 nm, although lesser and greater lateral recess distances can also be employed. In one embodiment, the surfaces of the second material layers (i.e., the sacrificial material layers 42) can be more hydrophobic than the surfaces of the first material layers (i.e., the insulator layers 32). In one embodiment, the sacrificial material layers 42 can comprise silicon nitride, and the insulator layers 32 can comprise silicon oxide.

Referring to FIG. 16B, the processing steps of FIG. 6C, the processing steps of FIGS. 7A and 7B, the processing steps of FIGS. 8A and 8B, the processing steps of FIGS. 9A and 9B, or the processing steps of FIGS. 10A and 10B can be performed to form a plurality of blocking dielectric portions 501. The plurality of blocking dielectric portions 501 can be formed by a selective deposition process in which a dielectric metal oxide material is deposited on the physically exposed surface of the second material layers (i.e., the sacrificial material layers 42) through the memory opening 49, while the dielectric metal oxide material does not grow from the surfaces of the first material layers (i.e., the insulator layers 32). The selective deposition process for the dielectric metal oxide has a shorter incubation time on the surfaces of the second material layers than on the surfaces of the first material layers. Optionally, deposition inhibitor layers 33 and/or or deposition promoter layers 37 described above may be used on respective surfaces of layers 32 and 42 exposed in the memory opening 49.

The plurality of blocking dielectric portions 501 is formed on the laterally recessed sidewalls of the second material layers (i.e., the sacrificial material layers 42). Each of the plurality of blocking dielectric portions 501 is vertically spaced apart, and does not contact any other of the plurality of blocking dielectric portions 501. The plurality of blocking dielectric portions 501 is formed on physically exposed surface portions (which may optionally be covered by the deposition promoter layer 37) of the second material layers after formation of the memory opening and prior to formation of the memory film 50.

Figure 16C:
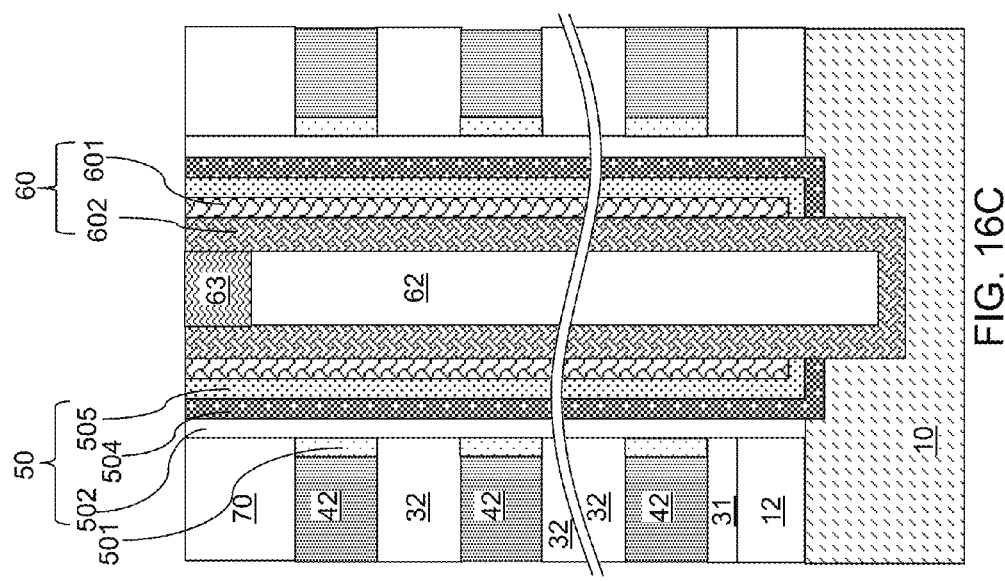

Referring to FIG. 16C, the processing steps of FIGS. 2B-2F are sequentially performed to form a lateral stack of material layers, which includes at least one blocking dielectric layer 502, a memory material layer 504, and a tunneling dielectric layer 505, and to form a semiconductor channel 60, a dielectric core 62, and a drain region 63 for each seventh exemplary memory stack structure. Subsequently, the processing steps of FIGS. 4, 5A, and 5B can be performed. The plurality of blocking dielectric portions 501 can comprise a material that is different from the material of the at least one blocking dielectric layer 502. In one embodiment, the blocking dielectric portions 501 can include a dielectric metal oxide, and the at least one blocking dielectric layer 503 can include silicon oxide and/or silicon oxynitride and/or a different dielectric metal oxide.

Referring to FIG. 17A, an in-process seventh exemplary memory stack structure is illustrated after the processing steps of FIGS. 5A and 5B. The backside recesses 43 are formed by removing the second material layers selective to the first material layers and the plurality of blocking dielectric portions 501. In other words, the plurality of blocking dielectric portions 501 is not etched by the etchant that removes the sacrificial material layers 42.

Referring to FIG. 17B, the processing steps of FIG. 6D can be performed to form electrically conductive layers 46 on the plurality of blocking dielectric portions 501 and the first material layers (i.e., the insulator layers 32). The plurality of blocking dielectric portions 501 is vertically spaced from each other, comprises dielectric metal oxide having a dielectric constant greater than 7.9, and contacts a respective portion of an outer sidewall of the memory film 50. Each of the plurality of blocking dielectric portions 501 contacts at least one horizontal surface of the insulator layers 32.

Each of the at least one blocking dielectric layer 502 can be a contiguous layer that extends through an entirety of the stack of alternating layers of the insulator layers 32 and the electrically conductive layers 46. Each of the plurality of blocking dielectric portions 501 contacts a portion of an outer sidewall of the at least one blocking dielectric layer 502. The outer sidewalls of the plurality of blocking dielectric portions 501 can be laterally spaced farther away from the memory material layer 504 than an outer sidewall of the at least one blocking dielectric layer 502. The plurality of blocking dielectric portions 501 is formed between the memory film 50 and the respective material layers (such as the sacrificial material layers 42 or the electrically conductive layers 46 that replace the sacrificial material layers 42)

by a selective deposition process that does not grow the dielectric metal oxide from the first material layers (i.e., the insulator layers 32).

Referring to FIG. 18A, an eighth in-process exemplary memory stack structure can be derived from the first in-process exemplary memory stack structure illustrated in FIG. 2A by performing the processing steps of FIG. 16B without performing the sacrificial layer 43 recessing in the memory opening step of FIG. 16A. A plurality of blocking dielectric portions 501 can be formed on physically exposed surface portions of the second material layers, i.e., the sacrificial material layers 42) after formation of the memory opening 49 and prior to formation of a memory film. In one embodiment, surfaces of the second material layers (i.e., the sacrificial material layers 42) in the memory opening 49 can be more hydrophobic than surfaces of the first material layers (i.e., the insulator layers 32) in the memory opening 49. In one embodiment, the outer sidewalls of the plurality of blocking dielectric portions 501 can be vertically coincident with the sidewalls of the insulator layers 32.

Referring to FIG. 18B, the processing steps of FIGS. 2B-2F can be sequentially performed to form a lateral stack of material layers, which comprise at least one blocking dielectric layer 502, a memory material layer 504, a tunneling dielectric layer 505, and to form a semiconductor channel 60, a dielectric core 62, and a drain region 63. Each of the plurality of blocking dielectric portions 501 is vertically spaced apart, and does not contact any other of the plurality of blocking dielectric portions 501. The plurality of blocking dielectric portions 501 comprises dielectric metal oxide having a dielectric constant greater than 7.9, and contacts a respective portion of an outer sidewall of the memory film 50.

Subsequently, the processing steps of FIGS. 4, 5A, and 5B can be performed. The plurality of blocking dielectric portions 501 can comprise a material that is different from the material of the at least one blocking dielectric layer 502. In one embodiment, the blocking dielectric portions 501 can include a dielectric metal oxide, and the at least one blocking dielectric layer 502 can include silicon oxide and/or silicon oxynitride and/or a different dielectric metal oxide.

Referring to FIG. 19A, an in-process seventh exemplary memory stack structure is illustrated after the processing steps of FIGS. 5A and 5B. The backside recesses 43 are formed by removing the second material layers selective to the first material layers and the plurality of blocking dielectric portions 501. In other words, the plurality of blocking dielectric portions 501 is not etched by the etchant that removes the sacrificial material layers 42.

Referring to FIG. 19B, the processing steps of FIG. 6D can be performed to form electrically conductive layers 46 on the plurality of blocking dielectric portions 501 and the first material layers (i.e., the insulator layers 32). The plurality of blocking dielectric portions 501 is vertically spaced from each other, comprises dielectric metal oxide having a dielectric constant greater than 7.9, and contacts a respective portion of an outer sidewall of the memory film 50. Each of the plurality of blocking dielectric portions 501 does not contact at least one horizontal surface of the insulator layers 32.

Each of the at least one blocking dielectric layer 502 can be a contiguous layer that extends through an entirety of the stack of alternating layers of the insulator layers 32 and the electrically conductive layers 46. Each of the plurality of blocking dielectric portions 501 contacts a portion of an outer sidewall of the at least one blocking dielectric layer 502. The outer sidewalls of the plurality of blocking dielectric portions 501 can be laterally spaced by a same distance from the memory material layer 504 as an outermost sidewall of the at least one blocking dielectric layer 502. The plurality of blocking dielectric portions 501 is formed between the memory film 50 and the respective material layers (such as the sacrificial material layers 42 or the electrically conductive layers 46 that replace the sacrificial material layers 42) by a selective deposition process that does not grow the dielectric metal oxide from the first material layers (i.e., the insulator layers 32).

In one embodiment, the at least one blocking dielectric layer 502 and the memory material layer 504 can have undulating inner sidewalls (502S, 504S) having a variable lateral distance from a vertical sidewall of the memory opening as a function of a height from a top surface of the substrate (9, 10).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional NAND memory device, comprising:
   a stack of alternating layers comprising insulator layers and electrically conductive layers and located over a substrate;
   a memory opening extending through the stack of alternating layers;
   a lateral stack located within the memory opening and comprising, from outside to inside, a memory film and a semiconductor channel; and
   a plurality of blocking dielectric portions vertically spaced from each other, comprising a dielectric metal oxide having a dielectric constant greater than 7.9, and contacting a respective portion of an outer sidewall of the memory film and a sidewall of a respective electrically conductive layer.

2. The monolithic three-dimensional NAND memory device of claim 1, wherein each of the plurality of blocking dielectric portions contacts at least one horizontal surface of the insulator layers.

3. The monolithic three-dimensional NAND memory device of claim 1, wherein the plurality of blocking dielectric portions comprise a material that is different from a material of the insulator layers.

4. The monolithic three-dimensional NAND memory device of claim 1, wherein:
   the memory film comprises a memory material layer and a tunneling dielectric layer;
   the plurality of blocking dielectric portions contacts an outer sidewall of the memory material layer; and
   the plurality of blocking dielectric portions comprises a material that is different from a material of the memory material layer.

5. The monolithic three-dimensional NAND memory device of claim 4, wherein a material of the memory material layer has a hydrophobicity that is different from a hydrophobicity of a material of the insulator layers.

6. The monolithic three-dimensional NAND memory device of claim 1, further comprising a plurality of dielectric material portions that are vertically spaced apart, comprising a different material than the plurality of blocking dielectric portions, and contacting an overlying blocking dielectric portion and an underlying blocking dielectric portion.

7. The monolithic three-dimensional NAND memory device of claim 6, wherein each of the plurality of dielectric material portions contact a sidewall of a respective insulator layer.

8. The monolithic three-dimensional NAND memory device of claim 6, wherein a dielectric material portion among the plurality of dielectric material portions has a lesser vertical extent than one of the insulator layers that contacts the dielectric material portion.

9. The monolithic three-dimensional NAND memory device of claim 6, wherein a blocking dielectric portion among the plurality of blocking dielectric portions has a greater vertical extent than one of the electrically conductive layers that contacts the blocking dielectric portion.

10. The monolithic three-dimensional NAND memory device of claim 6, wherein the plurality of dielectric material portions and the plurality of blocking dielectric portions constitute an alternating stack of annular structures.

11. The monolithic three-dimensional NAND memory device of claim 1, wherein an outer sidewall of one of the plurality of blocking dielectric portions contacts an sidewall of one of the insulator layers.

12. The monolithic three-dimensional NAND memory device of claim 1, wherein the memory film comprises, from outside to inside, a blocking dielectric layer, a memory material layer, and a tunneling dielectric layer.

13. The monolithic three-dimensional NAND memory device of claim 12, wherein the plurality of blocking dielectric portions comprise a material that is different from a material of the blocking dielectric layer.

14. The monolithic three-dimensional NAND memory device of claim 12, wherein a material of the blocking dielectric layer has a hydrophobicity that is different from a hydrophobicity of a material of the insulator layers.

15. The monolithic three-dimensional NAND memory device of claim 12, wherein the blocking dielectric layer comprises silicon nitride, and the insulator layers comprise silicon oxide.

16. The monolithic three-dimensional NAND memory device of claim 15, further comprising an inner blocking dielectric layer contacting the blocking dielectric layer and the memory material layer.

17. The monolithic three-dimensional NAND memory device of claim 12, wherein the blocking dielectric layer is a contiguous layer that extends through an entirety of the stack of alternating layers, and each of the plurality of blocking dielectric portions contacts a portion of an outer sidewall of the blocking dielectric layer.

18. The monolithic three-dimensional NAND memory device of claim 17, wherein outer sidewalls of the plurality of blocking dielectric portions are laterally spaced farther away from the memory material layer than an outer sidewall of the blocking dielectric layer.

19. The monolithic three-dimensional NAND memory device of claim 17, wherein outer sidewalls of the plurality of blocking dielectric portions are laterally spaced by a same distance from the memory material layer as an outer sidewall of the blocking dielectric layer.

20. The monolithic three-dimensional NAND memory device of claim 19, wherein the blocking dielectric layer and the memory material layer have undulating inner sidewalls having a variable lateral distance from a vertical sidewall of the memory opening as a function of a height from a top surface of the substrate.

21. The monolithic three-dimensional NAND memory device of claim 1, wherein each of the plurality of blocking dielectric portions comprises a vertical portion, an upper laterally-protruding portion that protrudes outward from an outer sidewall of the vertical portion, and a lower laterally-protruding portion that protrudes outward from the outer sidewall of the vertical portion.

22. The monolithic three-dimensional NAND memory device of claim 1, wherein the plurality of blocking dielectric portions comprises aluminum oxide and the insulator layers comprise silicon oxide.

23. The monolithic three-dimensional NAND memory device of claim 1, wherein the electrically conductive layers comprise, or are electrically connected to, a respective word line of the NAND memory device.

24. The monolithic three-dimensional NAND memory device of claim 14, wherein:
 the substrate comprises a silicon substrate;
 the NAND memory device comprises an array of monolithic three-dimensional NAND strings over the silicon substrate;
 at least one memory cell in the first device level of the three-dimensional array of NAND strings is located over another memory cell in the second device level of the three-dimensional array of NAND strings;
 the silicon substrate contains an integrated circuit comprising a driver circuit for the memory device located thereon; and
 each NAND string comprises:
  a plurality of semiconductor channels, wherein at least one end portion of each of the plurality of semiconductor channels extends substantially perpendicular to a top surface of the semiconductor substrate;
  a plurality of charge storage elements, each charge storage element located adjacent to a respective one of the plurality of semiconductor channels; and
  a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *